(12) United States Patent
Su et al.

(10) Patent No.: US 12,733,403 B2
(45) Date of Patent: Sep. 8, 2026

(54) QUARTZ CRYSTAL RESONATOR AND MANUFACTURING METHOD THEREOF

(71) Applicant: Diodes Incorporated, Plano, TX (US)

(72) Inventors: Po-Yang Su, Taoyuan City (TW); Yi-Sheng Chiang, Taoyuan City (TW); Han-Yun Tsai, Taoyuan City (TW); Ta-Jen Chou, Taoyuan City (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 19/274,468

(22) Filed: Jul. 18, 2025

(65) Prior Publication Data

US 2025/0351729 A1 Nov. 13, 2025

Related U.S. Application Data

(63) Continuation-in-part of application No. 18/208,707, filed on Jun. 12, 2023.

(30) Foreign Application Priority Data

Dec. 22, 2022 (CN) ......................... 202211657114.4

(51) Int. Cl.
*H10N 30/853* (2023.01)
*H10N 30/088* (2023.01)

(52) U.S. Cl.
CPC ......... *H10N 30/853* (2023.02); *H10N 30/088* (2023.02)

(58) Field of Classification Search
CPC ........ H03H 3/02; H03H 9/19; H03H 9/02023; H03B 5/32
See application file for complete search history.

(56) References Cited

U.S. PATENT DOCUMENTS

| | | | | |
|---|---|---|---|---|
| 4,306,170 A * | 12/1981 | Motte | ................ | H03H 9/02023 310/361 |
| 6,849,991 B2 | 2/2005 | Zhang et al. | | |
| 7,157,983 B2 * | 1/2007 | Tanaka | ............... | H03H 9/02551 331/158 |
| 2025/0351729 A1 * | 11/2025 | Su | ............................ | H03H 3/02 |

FOREIGN PATENT DOCUMENTS

| | | |
|---|---|---|
| JP | H10284978 A | 10/1998 |
| JP | 2003324332 A | 11/2003 |
| JP | 2007013381 A | 1/2007 |

OTHER PUBLICATIONS

Office Action for European Patent Application No. 23206581.3, mailed Oct. 30, 2025, 7 pages.

* cited by examiner

*Primary Examiner* — J. San Martin
(74) *Attorney, Agent, or Firm* — AP3 Law Firm PLLC

(57) ABSTRACT

A quartz crystal resonator including a quartz crystal obtained from a quartz bar is provided. The quartz crystal is cut from the quartz bar along a cutting plane in a coordinate system having an optic axis, an electrical axis and a mechanical axis perpendicular to each other. The cutting plane has a first angle of about 35° to about 36° from the optic axis and a second angle of about 14° to about 16° from the electrical axis. The quartz crystal has a vibration frequency deviation within a range from −30 parts per million (ppm) to about +30 ppm over a temperature range from about −50° C. to about 150° C. Methods for making the quartz crystal resonator are also provided.

20 Claims, 14 Drawing Sheets

QUARTZ CRYSTAL RESONATOR AND MANUFACTURING METHOD THEREOF

CROSS-REFERENCE TO RELATED APPLICATIONS

This patent application is continuation-in-part of U.S. patent application Ser. No. 18/208,707, filed on Jun. 12, 2023 and entitled "Quartz crystal resonator and manufacturing method," which claims priority to Chinese Application No. 202211657114.4, filed on Dec. 22, 2022 and entitled "Quartz crystal resonator and manufacturing method thereof." The aforementioned applications are hereby incorporated by reference herein as if reproduced in their entireties.

TECHNICAL FIELD

The present disclosure relates to the field of crystal resonators, and in particular embodiments, to a quartz crystal resonator and manufacturing method thereof.

BACKGROUND

With the advancement of the integrated circuit technologies, various machine controls that could only be handled by large scale computer systems in the past can now be controlled using semiconductor integrated circuits (such as large-scale integration (LSI), integrated circuits (ICs), and so on). In the operations of ICs and LSI, frequency is an indispensable element, e.g., for providing clock signals, for tracking time, for transmitting and receiving signals, and so on. A crystal resonator provides a simple, low-cost and high-accuracy frequency source, is applicable for a wide frequency range, and is a suitable choice for many applications, e.g., in equipment for satellite communications and mobile communications, and also in automobiles, televisions, computers or home appliances. It is desirable to develop techniques for crystal resonators to provide stable frequencies in a wide range of ambient temperatures.

SUMMARY

Technical advantages are generally achieved, by embodiments of this disclosure which describe a quartz crystal resonator and manufacturing method thereof.

In an exemplary aspect of the present disclosure, a quartz crystal resonator is provided. The quartz crystal resonator includes a quartz crystal cut from a quartz bar, and the quartz bar has a optic axis, an electrical axis and a mechanical axis perpendicular to one another. A first angle, rotated by about 35 degrees to about 36 degrees with the electrical axis as the rotating axis, is formed between a major face of the quartz crystal and the optic axis, and a second angle, rotated with the optic axis as the rotating axis, is formed between the major face and the electrical axis, such that the quartz crystal has a vibration frequency deviation inflection point from about 30 degrees Celsius to about 45 degrees Celsius.

In another exemplary aspect of the present disclosure, a method of manufacturing a quartz crystal resonator is provided. The method comprises: receiving a quartz bar, the quartz bar having a optic axis, an electrical axis, and a mechanical axis perpendicular to one another; with the electrical axis as the rotating axis, rotating a first angle θ of about 35 degrees to about 36 degrees from the direction of the optic axis toward the direction of the mechanical axis, and then with the optic axis as the rotating axis, rotating a second angle of about 10 degrees to about 12 degrees from the direction of the electrical axis toward the direction of the mechanical axis to obtain a cutting plane; and cutting the quartz bar along the cutting plane to obtain a quartz crystal.

In yet another exemplary aspect of the present disclosure, a method of manufacturing a quartz crystal resonator is provided. The method comprises: receiving a quartz bar, the quartz bar having an optic axis, an electrical axis, and a mechanical axis perpendicular to one another. axis; rotating the quartz bar to be at an AT-cut angle; based on the AT-cut angle, and with the optic axis as the rotating axis, rotating a correction angle from the direction of the electrical axis toward the direction of the mechanical axis, to obtain a cutting plane; and cutting the quartz bar along the cutting plane to obtain a quartz crystal; wherein, through the correction angle, the cut quartz crystal has a vibration frequency deviation between −20 ppm and +20 ppm in an operating temperature range from about −40 degrees Celsius to about 125 degrees Celsius.

In yet another aspect of the present disclosure, a quartz crystal resonator is provided. The quartz crystal resonator includes a quartz crystal obtained from a quartz bar, the quartz bar having an optic axis, an electrical axis along a length of the quartz bar, and a mechanical axis that are perpendicular to one another, and the quartz crystal having a major face cut from the quartz bar along a cutting plane, wherein the cutting plane has a first angle of about 35° to about 36° with the optic axis and has a second angle with the electrical axis, the first angle being obtained by rotation about the electrical axis, and the second angle being obtained by rotation about the optic axis, such that the quartz crystal has a vibration frequency deviation inflection point in a range from about 30° C. to about 45° C.

In yet another aspect of the present disclosure, a method for making a quartz crystal resonator is provided. The method includes: obtaining a quartz bar, the quartz bar having a optic axis, an electrical axis along a length of the quartz bar, and a mechanical axis that are perpendicular to one another; obtaining a cutting plane by rotating about the electrical axis through a first angle of about 35° to about 36° in a direction from the optic axis toward the mechanical axis, and thereafter, rotating about the optic axis through a second angle of about 10° to about 12° in a direction from the electrical axis to the mechanical axis; and cutting the quartz bar along the cutting plane to obtain a quartz crystal of the quartz crystal resonator.

In yet another aspect of the present disclosure, a method of making a quartz crystal resonator is provided. The method includes: obtaining a quartz bar, the quartz bar having a optic axis, an electrical axis along a length of the quartz bar, and a mechanical axis that are perpendicular to one another; rotating the quartz bar to orient the quartz bar at an AT-cut angle; based on the AT-cut angle, obtaining a cutting plane by rotating about the optic axis through an angle in a direction from the electrical axis toward the mechanical axis; and cutting the quartz bar along the cutting plane to obtain a quartz crystal of the quartz crystal resonator; and wherein the angle is determined such that the obtained quartz crystal has a vibration frequency deviation within a range from −20 parts per million (ppm) to +20 ppm over an operating temperature range from about −40° C. to about 125° C.

In yet another aspect of the present disclosure, a quartz crystal resonator is provided that includes a quartz crystal obtained from a quartz bar, the quartz crystal being cut from the quartz bar along a cutting plane in a coordinate system having an optic axis, an electrical axis and a mechanical axis perpendicular to each other, and the cutting plane having a first angle of about 35° to about 36° from the optic axis and a second angle of about 14° to about 16° from the electrical axis.

In yet another aspect of the present disclosure, a method of making a quartz crystal resonator is provided, which includes: obtaining a quartz bar; determining a cutting plane in a coordinate system comprising an optic axis, an electrical axis and a mechanical axis perpendicular to each other for cutting the quartz bar, the cutting plane having a first angle of about 35° to about 36° from the optic axis and a second angle of about 14° to about 16° from the electrical axis; and cutting the quartz bar along the cutting plane to obtain a quartz crystal of the quartz crystal resonator.

In yet another aspect of the present disclosure, a method of making a quartz crystal resonator is provided, which includes: obtaining a quartz bar in a coordinate system comprising an optic axis, an electrical axis and a mechanical axis perpendicular to each other; orienting the quartz bar to position a cutting plane of the quartz bar at an AT-cut angle; orienting the quartz bar to position the cutting plane at an angle of about 14° to about 16° from the electrical axis; and cutting the quartz bar along the cutting plane to obtain a quartz crystal of the quartz crystal resonator.

The quartz crystal resonators made in embodiments of the present disclosure provide a small vibration frequency deviation over a wide operating temperature range, e.g., from about −50° C. to about 150° C., and has good ambient temperature tolerance and improved operation performance.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Various aspects of the present disclosure may be best understood from the following description and accompanying drawings. It should be noted that, in accordance with standard working practice in the related art, various features in the drawings are not drawn to scale. In fact, the dimensions of some features may be enlarged or reduced on purpose for clarity of description.

The technical solutions and beneficial effects of the present application will be made apparent through the detailed description of embodiments of the present application in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
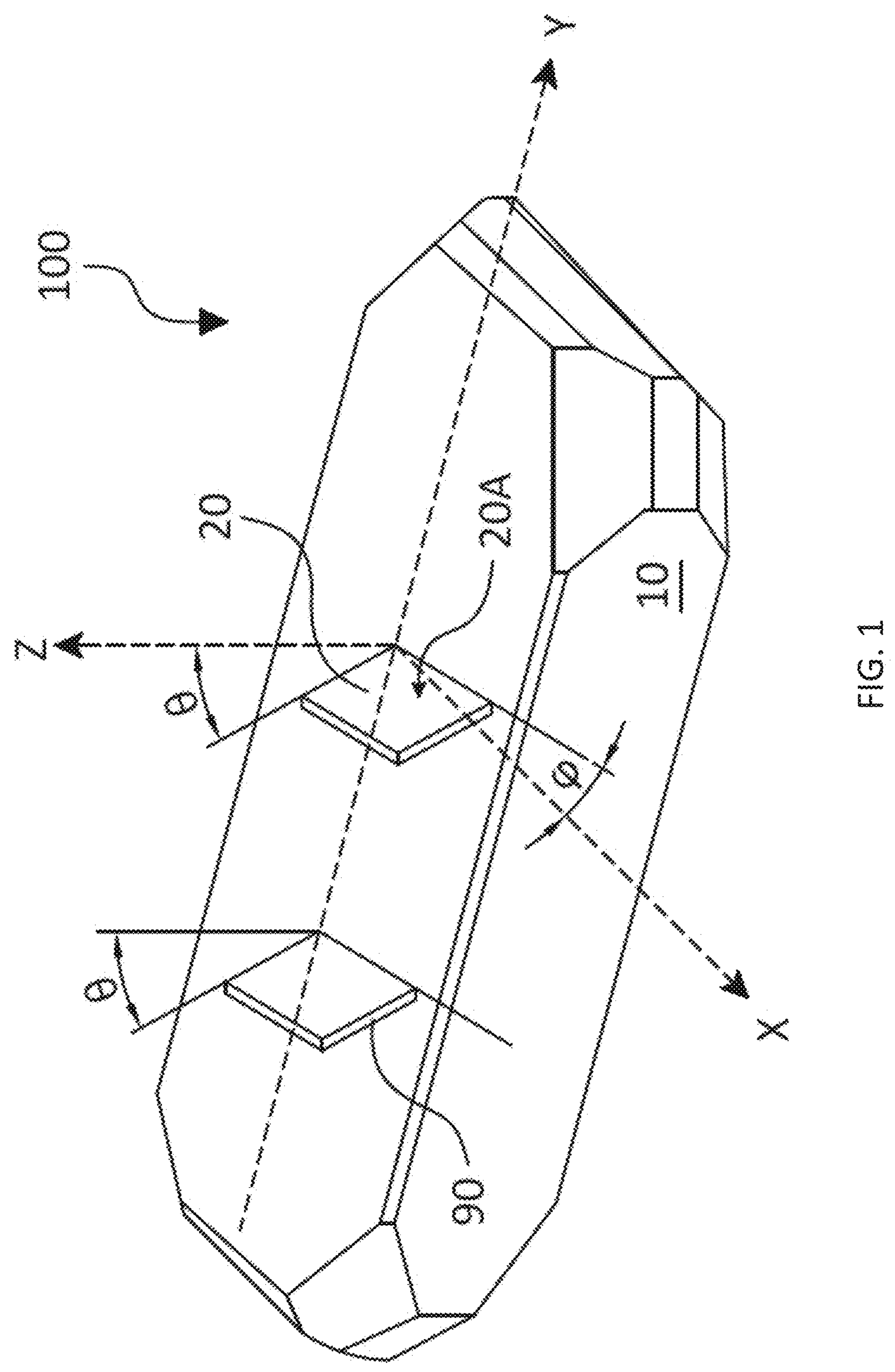
FIG. 1 is a schematic perspective view of a quartz bar showing a cutting method of the quartz bar according to some embodiments of the present disclosure.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Furthermore, one or more features from one or more of the following described embodiments may be combined to create alternative embodiments not explicitly described, and features suitable for such combinations are understood to be within the scope of this disclosure. It is therefore intended that the appended claims encompass any such modifications or embodiments.

The following provides various embodiments or examples for implementing different features of the present disclosure. Specific examples of components and configurations are described below to simplify description of the present disclosure. Certainly, these are examples only and are not intended to be limiting. For example, in the following description, a first member being formed above a second member or the first member being formed on the second member may include an embodiment where the first member and the second member are in direct contact, and also an embodiment where an additional member is formed between the first member and the second member such that the first member and the second member may not be in direct contact. Additionally, the present disclosure may repeat component symbols and/or letters in various examples. Such repetition is for simplicity and clarity, and does not in itself represent a relationship between the various embodiments and/or configurations discussed.

In addition, for ease of description, spatially relative terms such as "under", "beneath", "below", "above", "on" and the like may be used herein to describe a relationship of a component or member with another component(s) or member(s), as shown in the drawings. Spatially relative terms are intended to encompass different orientations of a device in use or operation in addition to the orientations depicted in the drawings. The device may be oriented in other ways (rotated 90 degrees or at other orientations), and the spatially relative terms used herein may be interpreted in a corresponding way similarly.

As used herein, terms such as "first", "second", "third", and so on, may be used to describe various components, members, regions, layers, and/or sections, and these components, members, regions, layers, and/or sections should not be limited by these terms. These terms may merely be used to distinguish one component, member, region, layer or section from another. The terms "first", "second", "third", and so on, when used herein, do not imply a sequence or order unless clearly indicated by the context.

A quartz crystal resonator is an electronic component that uses the piezoelectric effect of a quartz crystal to generate a high-accuracy vibration frequency. In particular, the quartz crystal itself is a passive component that can be manufactured as a so-called resonator. If the quartz crystal is combined with an integrated circuit designed with an oscillation circuit, it can be packaged as an active electronic component called a crystal oscillator (XO). Example products may include, based on their usage and specifications, a voltage-controlled crystal oscillator (VCXO), a temperature-compensated/voltage-controlled temperature-compensated crystal oscillator (TCXO/VCTCXO), a constant temperature control crystal oscillator (OCXO), and so on. Various electronic circuits need oscillators to synchronize activity or provide a frequency reference. For example, a microcontroller may use frequency signals generated by an oscillator to control movement of data to and from memory, execution of instructions, and external communication speeds. For another example, an oscillator in a radio system is used to provide a fixed frequency for communications of a transmitter and a receiver.

Quartz is widely used for manufacturing frequency determining devices because of its predictable thermal, mechanical, and electrical characteristics. The quartz crystal can provide a high-Q (quality factor) that is needed for precise frequency control in oscillators. A quartz crystal is a single crystal of silicon dioxide, and the quartz crystal (or quartz chip) required in industry may be cut from a quartz bar. A commonly used quartz bar is a perfect single-crystal α-quartz made through artificial growth. Because the quartz crystal is anisotropic, when the quartz crystal is cut from a quartz bar along different directions, different geometric slices may be obtained, and the different geometric slices have different oscillation modes. An advantage of the quartz crystal is that when temperature changes, the elastic coefficient and size that affect the oscillation frequency change slightly, and thus the frequency characteristic presented is relatively stable. In strict occasions that require high accuracy and stability of frequency, the temperature of the quartz crystal may be monitored in order to correct errors at any time. If a smaller error is required, in some cases, the quartz crystal or component including the quartz crystal may be placed in an incubator and a vibration-absorbing container, to prevent from interferences caused by external temperature and vibration.

Performance indicators of a quartz crystal resonator may include accuracy, stability, power consumption, and so on. Among them, the accuracy and stability are very important for communication protocols and time recording. The accuracy and stability of a quartz crystal resonator are closely related to properties of the quartz crystal that the quartz crystal resonator includes.

The oscillation of the quartz crystal is based on the piezoelectric effect. The piezoelectric effect is a phenomenon where an electric charge is generated in response to application of a mechanical force/stress on a material, and the shape of the material changes in response to the material placed in an electric field (e.g., a voltage is applied). The piezoelectric effect causes conversion between mechanical energy and electrical energy.

For the quartz crystal, when a pressure is applied to the quartz crystal, a voltage is generated inside (across) the quartz crystal, which is referred to as a positive piezoelectric effect; and when a voltage is applied to the quartz crystal, the inside of the quartz crystal is deformed (i.e., the quartz crystal undergoes a physical deformation, such as stretching, compressing or bending), which is referred to as a reverse piezoelectric effect. The piezoelectric effect of the quartz crystal allows it to produce an electric charge on its surfaces when the surfaces are distorted or subjected to pressure. This distortion allows the quartz crystal to vibrate at a particular resonant frequency. For example, application of an alternating voltage on the quartz crystal causes mechanical vibration of the quartz crystal at a frequency. The frequency accuracy is measured in parts per million (ppm). A quartz crystal with feedback can serve as a highly accurate and stable resonator, and its natural frequency depends on the size and cutting manner of the crystal.

In commonly used quartz crystal resonators, thin slices may be cut from a quartz bar by means of a cutting method, such as AT-cut, and the slices are used as the quartz crystals of the quartz crystal resonators. A slice may be in the shape of a circular disc or rectangular plate. A slice of quartz crystal cut from the quartz bar may also be referred to as a quartz crystal, a quartz wafer, a plate, a quartz crystal blank, or a quartz blank, which are used interchangeably in the. A quartz crystal resonator may include one slice of quartz crystal cut from the quartz bar according to a specific cutting method. As mentioned above, the choice of angles of cutting the slices affects the physical and electrical parameters of the quartz crystal resonators.

In a quartz crystal model, as shown in FIG. 1 as an example, three mutually perpendicular axes (X, Y and Z axes, which are also referred to as an orthogonal X, Y, Z coordinate system, or X-Y-Z coordinate system) are used to represent the directions of quartz crystal. The orthogonal X-Y-Z coordinate system may serve as a reference of directions for the purpose of cutting slices of quartz crystal from a quartz bar. The X-Y-Z coordinate system may be defined based on the quartz bar.

FIG. 1 is a schematic diagram 100 of a quartz bar 10 in the X-Y-Z coordinate system. The vertical axis is the optic axis (i.e., Z axis). The optic axis represents a direction along which light experiences no birefringence or double refraction in the quartz bar. The axis passing through the ridgeline of the quartz bar and perpendicular to the optic axis Z is the electrical axis (i.e., X axis). The axis perpendicular to the optic axis Z and the electrical axis X is the mechanical axis (i.e., Y axis). Generally speaking, the piezoelectric effect that generates electric charges under a force along the electrical axis X is called a longitudinal piezoelectric effect; the piezoelectric effect that generates electric charges under a force along the mechanical axis Y is called a transverse piezoelectric effect. There is no piezoelectric effect occurring when a force is applied in the direction of the optic axis Z.

As used herein, according to the definition of angles, an angle formed by rotating counterclockwise in the X-Y-Z coordinate system is a positive angle, and an angle formed by rotating clockwise in the X-Y-Z coordinate system is a negative angle. Further as used herein, θ is used to represent an angle from the Z axis, and φ is used to represent an angle from the X axis. Examples of quartz crystal slices cut from a quartz bar are shown as rectangle plates, for illustrative purposes in the embodiments of the present disclosure.

As an example, FIG. 1 shows a slice of quartz crystal 90 that is cut from the quartz bar 10 according to the method of AT-cut (referred to as AT-cut quartz crystal 90). The AT-cut quartz crystal 90 is obtained by cutting the crystal bar 10 at an angle θ of about 35° from the direction of the optic axis Z toward the direction of the mechanical axis Y. The projection of the major face of the AT-cut quartz crystal 90 on the Y-Z plane has an angle θ of about 35° from the Z axis. In some specific examples, the AT-cut is to cut from the direction of the optic axis Z to the direction of the mechanical axis Y at an angle of 35 degrees 15 minutes (i.e., θ=35° 15') or 35 degrees 25 minutes (i.e., θ=35° 25').

In addition to the AT-cut, there are also other cutting methods provided based on actual needs, such as BT-cut, SC-cut, and so on. BT-cut is to cut the quartz bar 10 from the direction of the optic axis Z to the direction of the mechanical axis Y at an angle θ of about negative 50°. In some specific examples, the angle θ is negative 49° (θ=−49°) or negative 51° 7' (θ=−51° 7').

SC-cut is carried out through double rotation, by first performing angle selection from the direction of the optic axis Z toward the direction of the mechanical axis Y at an angle θ of about 35°, and rotating about 21° from the direction of the electrical axis X toward the direction of the mechanical axis Y (i.e., φ=21°) to perform cutting. In some specific examples, these angles include a combination of 34 degrees 11 minutes and 21 degrees 93 minutes (θ=34° 11' and φ=21° 93') respectively, or a combination of 35 degrees 15 minutes and 21 degrees 54 minutes respectively (θ=35° 15' and φ=21° 54').

Other cutting methods may include variations such as GT-cut, IT-cut, and so on, and their specific cutting angles may be fine-tuned based on different characteristics, with fairly small variances between different manufacturing examples (e.g., the angle difference between 35° 15' and 35° 25' in the AT-cut).

The quartz crystals obtained by cutting the quartz bar along different angles are different in various aspects, such as electromechanical conversion type, conversion efficiency, piezoelectric coefficient, elastic coefficient, dielectric constant, temperature characteristics and resonance frequency, and thus, different cutting schemes may be selected to use based on parameters required by quartz crystal resonators.

In some cases, quartz crystal resonators are required to provide a certain level of accuracy performance when operating in an environment of a wide range temperatures, such as a cold or hot working environment. Quartz crystals used to make such quartz crystal resonators need to have tolerance to a certain range of temperature changes, maintaining an acceptable frequency deviation.

Taking automotive electronics as an example, the automotive specification verification standards formulated by the International Automotive Electronics Council (AEC), such as the AEC-Q101 standard and the AEC-Q200 REV D standard, specify different temperature ranges required for automotive electronic devices/components according to different grades. Table 1 below shows an example of the AEC-Q200 REV D standard. Table 1 shows five grades, i.e., grade 0-4, and a temperature range required by each grade for certain electronic devices/components in an typical/example application. For example, grade 1 requires that electronic devices/components, such as capacitor networks, resistors, inductors, transformers, thermistors, resonators, crystals and varistors, and ceramic and tantalum capacitors, tolerate a temperature range from −40° C. to 125° C. for most underhood applications. The temperature range from about −40° C. to about 125° C. also belongs to the discrete semiconductor operating temperature range specified by AEC-Q101 standard. For another example, grade 0 requires that electronic devices/components, such as flap chip ceramic resistors, X8R ceramic capacitors, tolerate a temperature range from −50° C. to 150° C. for all automotive applications. The temperature ranges {−40° C., 125° C.} and {−50° C., 150° C.} are examples of relatively wide operating temperature ranges defined in the industry.

TABLE 1

| GRADE | TEMPERATURE RANGE MINIMUM | TEMPERATURE RANGE MAXIMUM | PASSIVE COMPONENT TYPE Maximum capability unless otherwise specified and qualified | TYPICAL/EXAMPLE APPLICATION |
|---|---|---|---|---|
| 0 | −50° C. | +150° C. | Flat chip ceramic resistors, X8R ceramic capacitors | All automotive |
| 1 | −40° C. | +125° C. | Capacitor Networks, Resistors, Inductors, Transformers, Thermistors, Resonators, Crystals and Varistors, all other ceramic and tantalum capacitors | Most underhood |
| 2 | −40° C. | +105° C. | Aluminum Electrolytic capacitors | Passenger compartment hot spots |
| 3 | −40° C. | +85° C. | Film capacitors, Ferrites, | Most passenger |

TABLE 1-continued

| GRADE | TEMPERATURE RANGE MINIMUM | TEMPERATURE RANGE MAXIMUM | PASSIVE COMPONENT TYPE Maximum capability unless otherwise specified and qualified | TYPICAL/EXAMPLE APPLICATION |
|---|---|---|---|---|
| | | | R/R-C Networks and Trimmer capacitors | compartment |
| 4 | 0° C. | +70° C. | | Non-automotive |

The vibration frequency of a quartz crystal may change with the ambient temperature. For example, a quartz crystal may be cut according to a cutting method in order to obtain a desired vibration frequency for a specific temperature range (also referred to as an original target frequency, or a nominal center frequency). When operating beyond this temperature range, the vibration frequency of the quartz crystal may deviate from its designed vibration frequency, and thus the accuracy of the vibration frequency degrades. It is desirable that quartz crystals have the characteristics of maintaining an acceptable vibration frequency deviation over a wide operating temperature range, to accommodate various applications, e.g., the automotive applications as mentioned above.

Embodiments of the present disclosure provide, based on the consideration of the vibration frequency deviation of the quartz crystal in a specific operating temperature range, quartz bar cutting methods to obtain quartz crystals that can maintain a relatively stable vibration frequency deviation in a large operating temperature range, especially in an extreme working environment having high temperature and low temperature. The quartz crystals may be used to manufacture high-quality quartz crystal resonators with good environmental tolerance. The quartz crystal resonators exhibit a small vibration frequency deviation over a wide operating temperature range provides a significant advantage in applications.

The vibration frequency deviation indicates that the actual resonance frequency of a quartz crystal deviates from the original target frequency of the quartz crystal due to temperature changes, and the degree of deviation is usually in a unit of parts per million (ppm), e.g., 0 ppm indicates no deviation. In some embodiments, requirements may be specified for quartz crystals regarding operating temperature range and allowable/acceptable vibration frequency deviation (e.g., ppm), and a cutting method may be designed in order to satisfy a specific requirement. The requirements may be defined based on various applications and needs.

For illustration purposes, in the following description, the automotive electronics are used as examples of applications. Embodiments of the present disclosure may be readily extended to other industries or applications without departing from the spirit and principle of the present disclosure.

Table 2 below shows two example requirements (Requirement I and Requirement II) defined according to the AEC-Q200 REV D standard.

TABLE 2

| Requirement | Operating Temperature Range | Vibration Frequency Deviation (ppm) |
|---|---|---|
| I | About −40° C.~about 125° C. | ±20 |
| II | About −50° C.~about 150° C. | ±30 |

For example, Requirement I may be defined in order to satisfy the requirements of Grade 1 in Table 1, Requirement II may be defined in order to satisfy the requirements of Grade 0 in Table 1. As shown in Table 2, Requirement I specifies that the allowable range of the vibration frequency deviation of quartz crystals for precision components is set to be ±20 ppm under an operating temperature range of about {−40° C., 125° C.}. That is, when the ambient temperature varies in an approximate range of {−40° C., 125° C.}, a vibration frequency deviation of a quartz crystal should be within the range of {−20 ppm, +20 ppm}. Requirement II specifies that the allowable range of the vibration frequency deviation of quartz crystals (e.g., for precision components) is set to be ±30 ppm under an operating temperature range of about {−50° C., 150° C.}. That is, when the ambient temperature varies in an approximate range of {−50° C., 150° C.}, a vibration frequency deviation of a quartz crystal should be within the range of {−30 ppm, +30 ppm}. Various other requirements may be defined according to the standards of the automotive electronics.

In some embodiments of the present disclosure, as shown in FIG. 1, a quartz crystal 20 included in a quartz crystal resonator may be cut out from the quartz bar 10, and the quartz bar 10 has the optic axis (Z), the electrical axis (X) and the mechanical axis (Y) perpendicular to one another. Between a major face 20A of the quartz crystal 20 and the optic axis Z is a first angle θ that is rotated around the electrical axis X by about 35 degrees to about 36 degrees, and between the major face 20A and the electrical axis X is a second angle φ that is formed by rotating around the optic axis Z. That is, a cutting plane of the quartz crystal 20 (parallel to the major face 20A) may be determined by first rotating an angle θ from the Z axis to the Y axis, and then rotating an angle φ from the X axis to the Y axis.

In some embodiments, characteristics of the quartz crystal 20 include an inflection point of a vibration frequency deviation at about 30° C. (degrees Celsius) to about 45° C. The inflection point refers to the point where a curve changes from convex to concave or from concave to convex. The curve shows the relationship between the vibration frequency deviation and temperature of a quartz crystal. The inflection point may also be determined by the tangent of the curve passing through the curve at the point, and its technical meaning is that the quartz crystal has the most stable vibrational pattern at the corresponding temperature of the inflection point.

Figure 2:
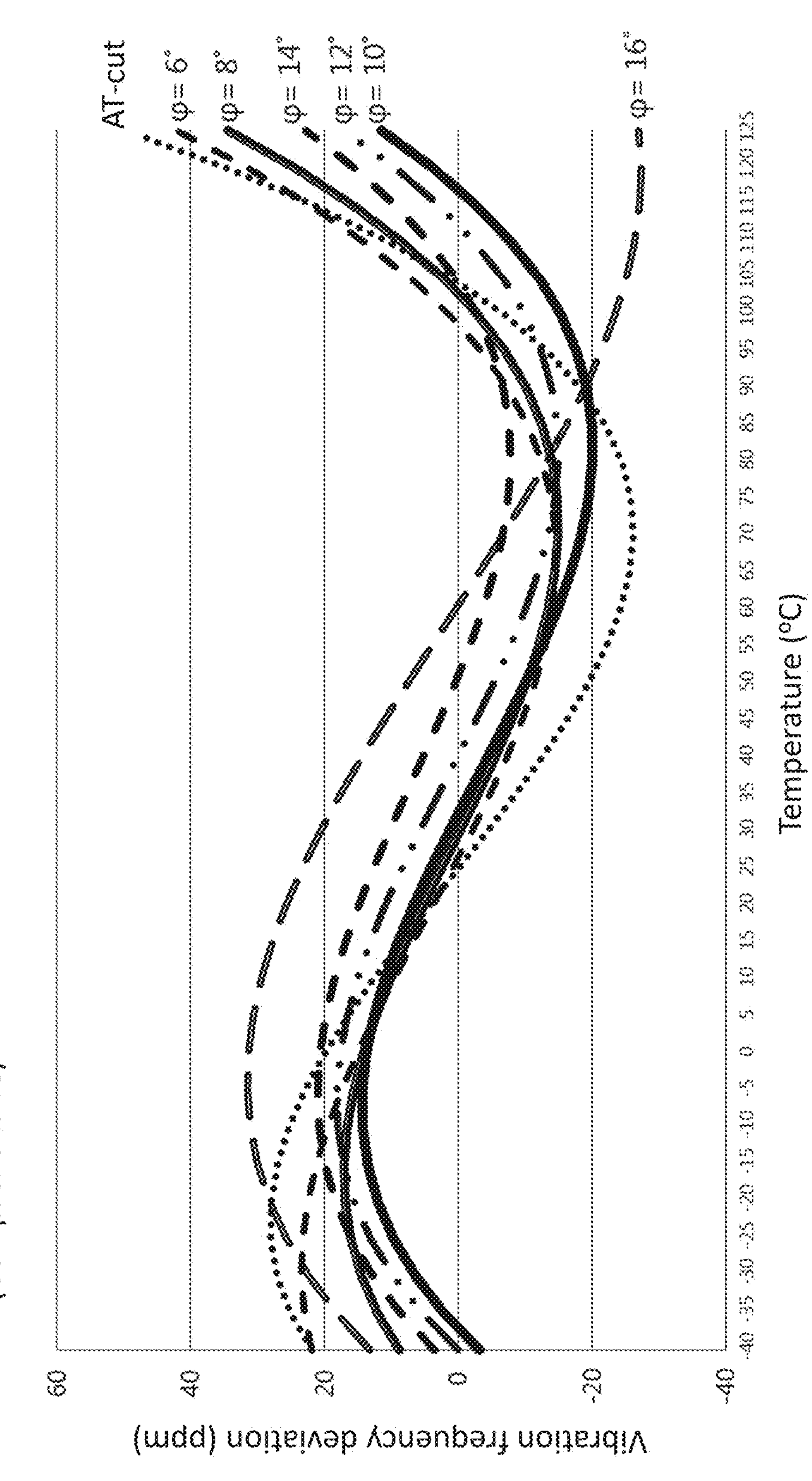
FIG. 2 is a graph showing a relationship between temperature and vibration frequency deviation (comprehensive) according to some embodiments of the present disclosure.

FIG. 2 is a graph of relationships between vibration frequency deviation (ppm) and temperature (° C.) of quartz crystals cut by use of different cutting methods according to some embodiments of the present disclosure. The cutting methods include the AT-cut, and double rotation methods having the same first angle θ and different second angles φ (φ=6°, 8°, 10°, 12°, 14°, and 16°, respectively).

As shown in FIG. 2, the relationships between temperature and vibration frequency deviation of the quartz crystals according to the above embodiments of the present disclosure present the characteristics of cubic curves, and the inflection point—in the example where the second angle φ is 10° or 12°—falls within the range from about 30° C. to about 45° C.

The above-mentioned temperature range is related to a selectable range of cutting angles of the quartz crystals. In some embodiments, the first angle θ is between about 35 degrees and about 36 degrees. In some embodiments, the first angle θ is about 35 degrees 15 minutes. In some embodiments, the first angle θ is about 35 degrees 25 minutes. In some embodiments, the first angle θ is the same as the cutting angle typically selected for the AT-cut (see the AT-cut quartz crystal 90 as shown in FIG. 1). In other words, according to some embodiments of the present disclosure, the first angle θ may be determined based on the AT-cut angle selection, rotation by the second angle φ may then be performed, and thereafter the quartz bar is cut.

As for the range of the second angle φ, in some embodiments, the second angle φ is between about 10 degrees and about 12 degrees. In some embodiments, the second angle φ is about 10 degrees. In some embodiments, the second angle φ is about 12 degrees. In some embodiments, the selection of the second angle φ may be based on the consideration that the cut quartz crystal can maintain the vibration frequency deviation within an acceptable range (e.g., within ±20 ppm) in a wide operating temperature range (for example, from about −40° C. to about 125° C.).

In particular, the quartz crystal resonator of embodiments of the present disclosure uses a quartz crystal having better tolerance to temperature changes, so that the quartz crystal resonator has a certain level of accuracy performance in either a cold or hot working environment. Considering that the quartz crystal obtained through the fixed quartz bar cutting method does not have the characteristics of maintaining a good vibration frequency deviation over a wide operating temperature range, the quartz crystal resonator of the present disclosure exhibiting a small vibration frequency deviation over the above operating temperature range provides a significant advantage in applications. The existing cutting methods do not satisfy the requirement I as shown in Table 2.

Regarding the operations of a quartz crystal in an operating temperature range, for example, as shown in the graph (comprehensive) of the relationship between temperature and vibration frequency deviation in FIG. 2, a quartz crystal cut by use of the AT-cut has an inflection point of the vibration frequency deviation at the room temperature (about 25° C.), and at this temperature, the AT-cut quartz crystal has the characteristic of having no vibration frequency deviation, which is the reason that AT-cut quartz crystals are widely used. However, once the operating temperature changes, e.g., when the temperature rises to about 50° C. or drops to about 0° C., the vibration frequency deviation of the AT-cut quartz crystal will go beyond the range of ±20 ppm due to drastic changes. Specifically, the relationship between the temperature and the vibration frequency deviation of the AT-cut quartz crystal is also characterized by a cubic curve. The AT-cut quartz crystal has a negative peak value of the vibration frequency deviation that is about −26.2 ppm at about 70° C. As the temperature rises, the vibration frequency deviation can be maintained within the range between 20 ppm and −20 ppm in the temperature range from about 90° C. to about 110° C., however, after the temperature rises above about 110° C., the vibration frequency deviation increases continuously and sharply, reaching about 50 ppm at about 125° C., which is no longer in an allowable vibration frequency deviation level. On the other hand, in the cases of lower operating temperatures, the AT-cut quartz crystal also has a vibration frequency deviation exceeding 20 ppm in the sub-zero operating temperature range from about −40° C. to about 0° C., which means that the AT-cut quartz crystal does not perform well at low temperatures.

In view of the above description that the characteristics of the quartz crystals obtained by the AT-cut do not meet the requirements of the vibration frequency deviation in some operating temperature ranges, e.g., the Requirement 1, embodiments of the present disclosure use the second angle φ as a correction angle (in other words, the AT-cut can be regarded as a case where the second angle φ is 0 degree), and utilize the characteristics of the quartz crystal obtained by further rotating an angle at which the quartz bar is to be cut, in order for the quartz crystal to meet the requirement of the vibration frequency deviation in a wide operating temperature range, e.g., the Requirement 1.

Figure 3:
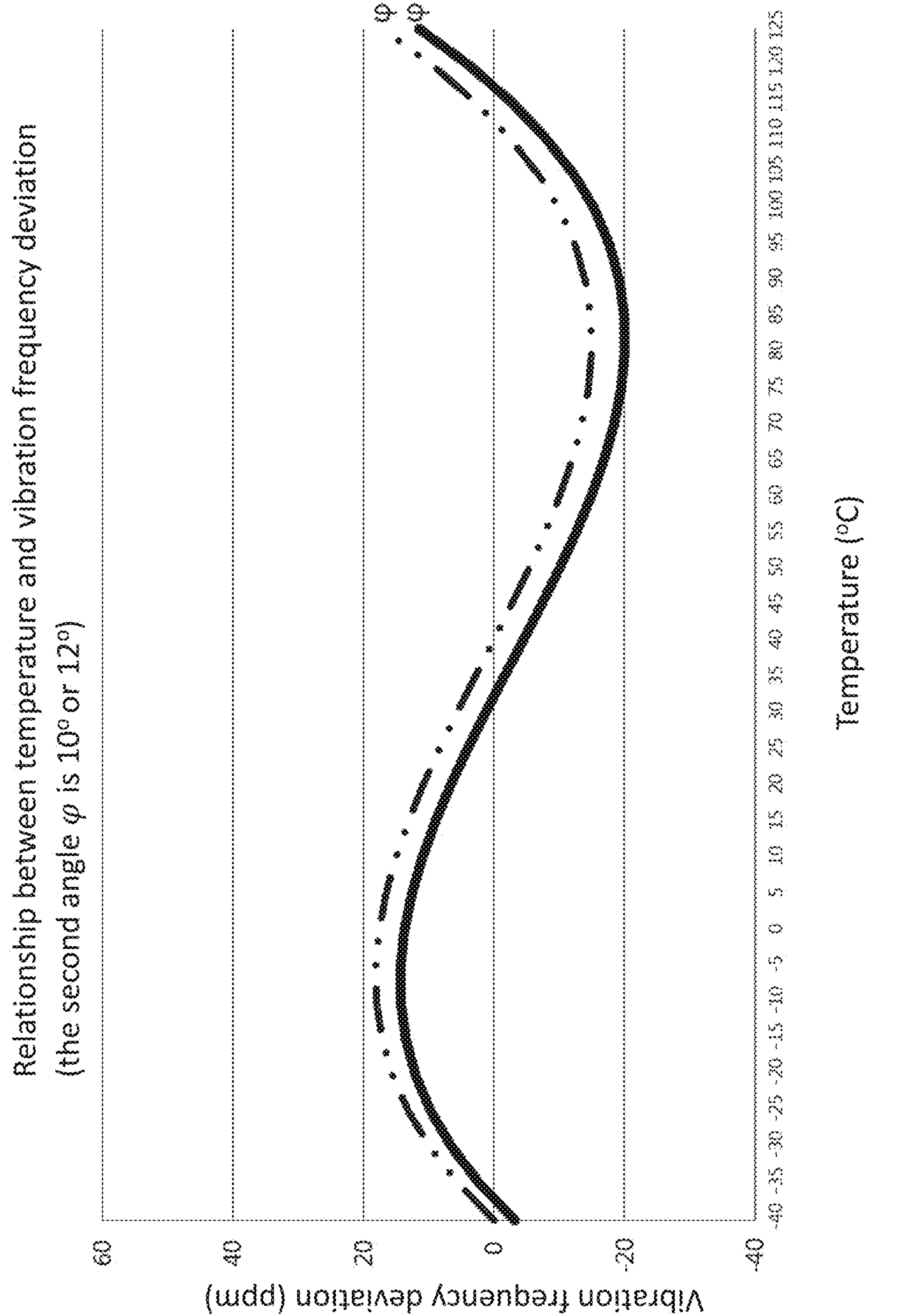
FIG. 3 is a graph showing a relationship between temperature and vibration frequency deviation according to some embodiments of the present disclosure (a second angle $\varphi$ is 10 degrees or 12 degrees)

As mentioned above, in some embodiments of the present disclosure, the second angle φ is between about 10 degrees and about 12 degrees. Taking the second angle φ being 10 degrees as an example, the first angle θ as disclosed above may be formed between the major face 20A of the quartz crystal 20 and the optic axis (Z) by rotating about the electrical axis, the second angle φ of 10 degrees may then be formed between the major face 20A and the electrical axis (X) by rotating about the optic axis (Z), and thereafter, the quartz bar is cut. The quartz crystal obtained in this way has a relationship between temperature and vibration frequency deviation as shown in FIG. 3, which has the characteristics of a cubic curve, and has a vibration frequency deviation within ±20 ppm in the operating temperature range from about −40° C. to about 125° C. In particular, the quartz crystal has a positive peak value of the vibration frequency deviation that is about 14 ppm in the range from about −10° C. to about −5° C.; and it has a negative peak value of the vibration frequency deviation that is about −20 ppm in the range from about 80° C. to about 85° C. In addition, the quartz crystal has a vibration frequency deviation inflection point in the range from about 30° C. to about 35° C.

If the second angle φ is adjusted to be 12°, as shown in FIG. 3, the relationship between temperature and vibration frequency deviation of the obtained quartz crystal also presents the characteristics of a cubic curve, and the vibration frequency deviation is within ±20 ppm in the operating temperature range between about −40° C. and about 125° C. In particular, in the range from about −10° C. to about −5° C., the quartz crystal has a positive peak value of the vibration frequency deviation that is about 18 ppm; and in the range from about 80° C. to about 85° C., the vibration frequency deviation has a negative peak value of about −15 ppm. In addition, the quartz crystal has a vibration frequency deviation inflection point in the range from about 40° C. to about 45° C.

The above-described embodiments of the present disclosure use a difference of two degrees as an exemplary example (i.e., 10° and 12°), however, the second angle φ is not limited to be only about 10 degrees or about 12 degrees. When the second angle φ is within the range from about 10 degrees to about 12 degrees, the cut quartz crystal is able to have a vibration frequency deviation within ±20 ppm in the operating temperature range between about −40° C. and about 125° C., and the inflection point of the vibration frequency deviation of the quartz crystal falls within the range from about 30° C. to about 35° C. or the range from about 40° C. to about 45° C., i.e., the inflection point of the vibration frequency deviation varies in these temperature ranges with a small adjustment of the second angle φ.

Figure 4:
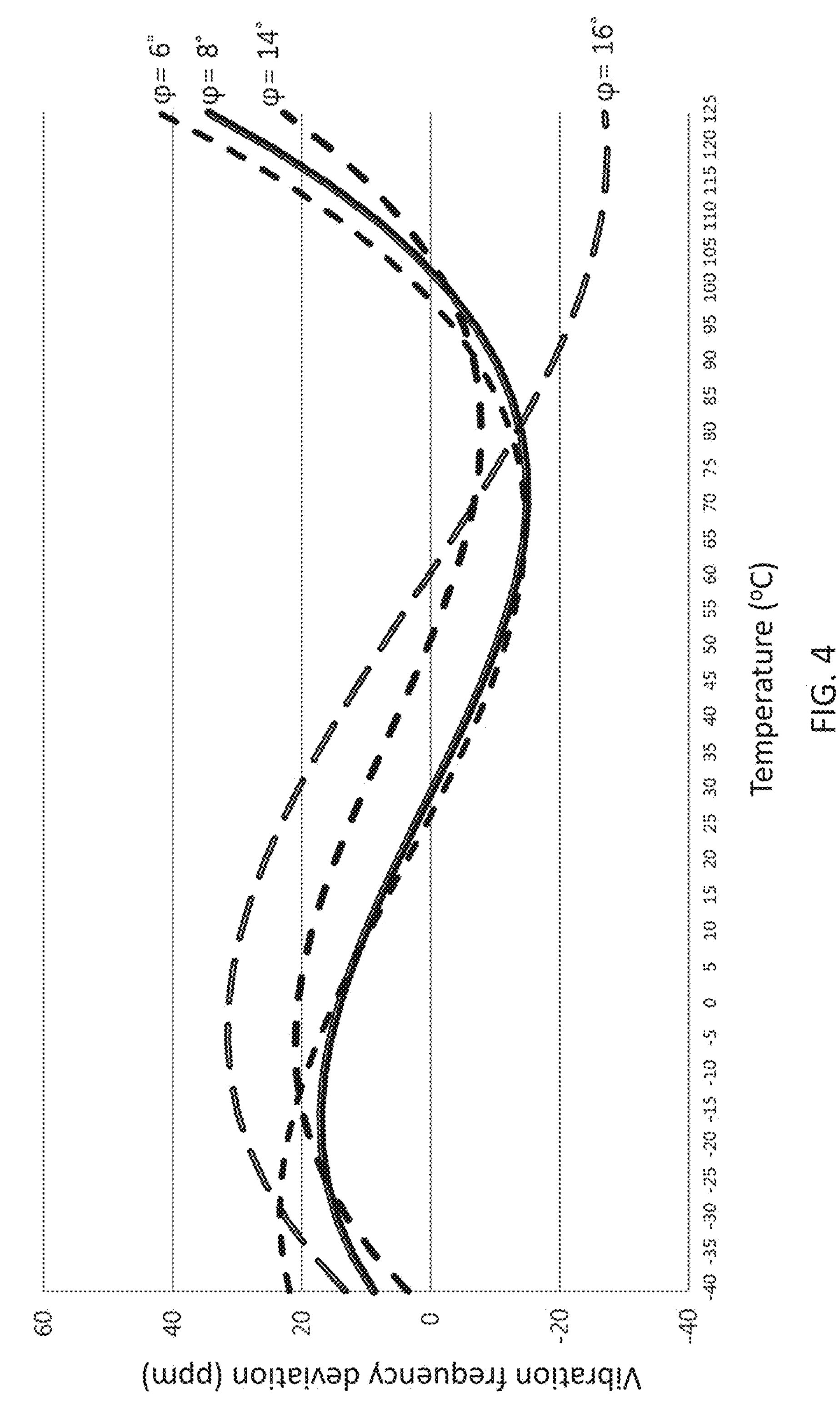
FIG. 4 is a graph showing a relationship between temperature and vibration frequency deviation according to some comparative examples (the second angle $\varphi$ is 6 degrees, 8 degrees, 14 degrees or 16 degrees)

In some comparative embodiments, as shown in FIG. 4, without changing the first angle θ, if the second angle φ is adjusted to be a relatively small angle such as about 6 degrees, about 8 degrees, and so on, or the second angle φ is adjusted to be a relatively large angle such as about 14 degrees, about 16 degrees, and so on, for the quartz crystals obtained with these comparative angles, the corresponding relationship between temperature and vibration frequency deviation will have vibration frequency deviation values beyond the range of ±20 ppm in the operating temperature range from about −40° C. to 125° C. Thus, such obtained quartz crystals do not meet the component operation quality standard set for the above operating temperature ranges, e.g., the Requirement I.

For example, first, as shown in FIG. 4, when the second angle φ is adjusted to be about 6°, the obtained quartz crystal has vibration frequency deviation values that change relatively severely in the low temperature range from about −40° C. to about −15° C. and in the high temperature range from about 115° C. to about 125° C., and does not meet the standard/requirement.

Second, as shown in FIG. 4, when the second angle φ is adjusted to be about 8°, although this case is relatively close to an embodiment of the present disclosure with the second angle φ being about 10°, the obtained quartz crystal still has vibration frequency deviation values that change relatively severely in the high temperature range from about 120° C. to about 125° C., and does not meet the standard/requirement.

Third, as shown in FIG. 4, when the second angle φ is adjusted to be about 14°, the obtained quartz crystal has vibration frequency deviation values that change relatively severely in the low temperature range from about −10° C. to about 0° C. and the high temperature range from about 120° C. to about 125° C., and does not meet the standard/requirement.

Further as shown in FIG. 4, when the second angle φ is adjusted to be about 16°, the obtained quartz crystal has vibration frequency deviation values that change relatively severely in the temperature range from about −30° C. to about 30° C. and in the temperature range from about 95° C. to about 125° C., and does not meet the standard/requirement.

In view of above, the embodiments of the present disclosure provide a quartz bar, and the cutting angle obtained by double rotation enables a quartz crystal that is cut from the quartz bar at this cutting angle to maintain a better vibration frequency deviation in a larger operating temperature range, which enables a quartz crystal resonator utilizing the quartz crystal to comply with stricter industrial standards and be suitable for operating environments with more severe temperature changes.

Figure 5:
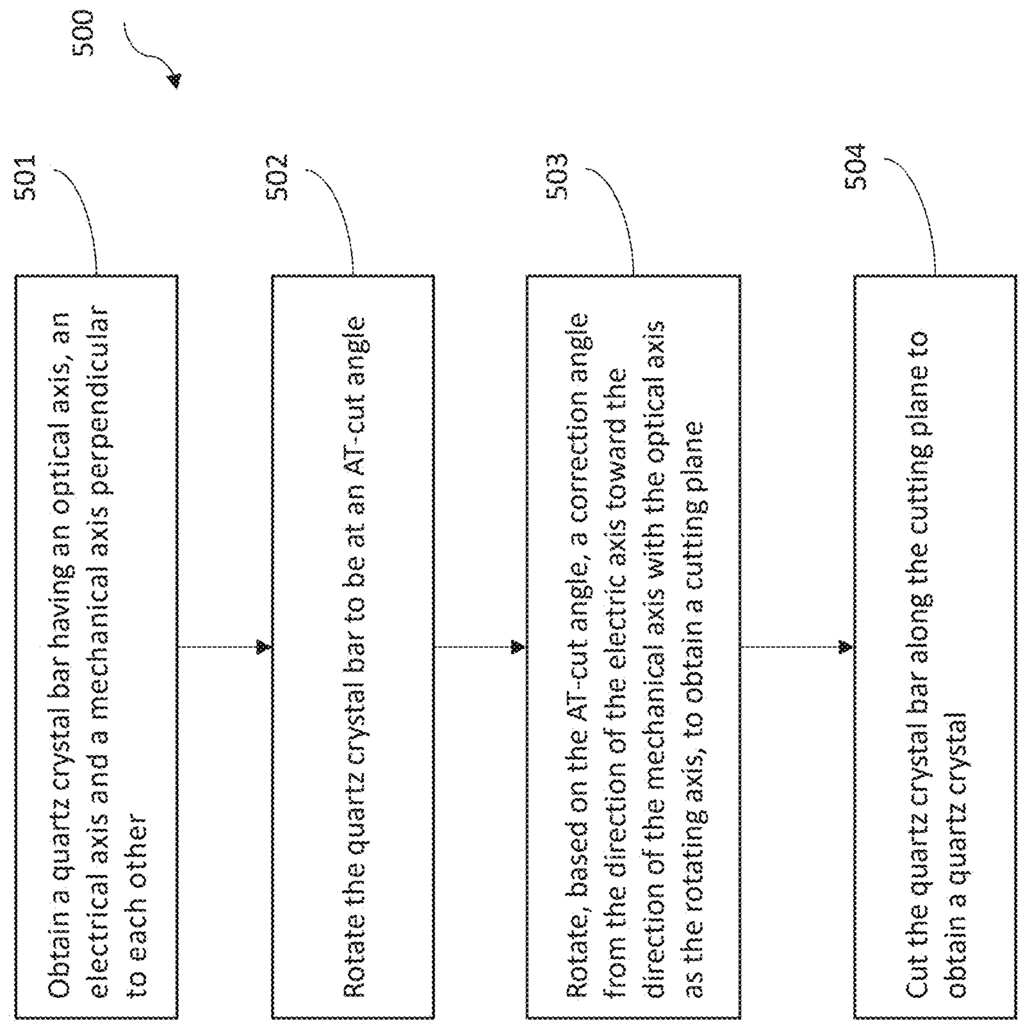
FIG. 5 is a flowchart of a method for making a quartz crystal resonator according to some embodiments of the present disclosure.

In some embodiments of the present disclosure, a method is also provided for making a quartz crystal resonator. FIG. 5 is a flowchart of an example method 500 of making a quartz crystal resonator according to embodiments of the present disclosure. As shown in FIG. 5, the method 500 includes step 501: obtaining a quartz bar, which has an optic axis, an electrical axis and a mechanical axis perpendicular to one another; Step 502: rotating the quartz bar to be at an AT-cut angle; Step 503: based on the AT-cut angle, and rotating a correction angle from the direction of the electrical axis toward the direction of the mechanical axis with the optic axis as the rotating axis, to obtain a cutting plane; and step 504: cutting the quartz bar along the cutting plane to obtain a quartz crystal. In this way, by the use of the correction angle, the cut quartz crystal can have a vibration frequency deviation within ±20 ppm in an operating temperature range from about −40° C. to about 125° C. Further, in some embodiments, the AT-cut angle is an angle rotated by about 35 degrees to about 36 degrees from the direction of the optic axis to the direction of the mechanical axis, with the electrical axis as the rotating axis.

In some embodiments, the cut quartz crystal may be included in a structure of a quartz crystal resonator through a packaging process. In addition, the vibration frequency of the quartz crystal is related to the thickness of the quartz crystal, for example, as the vibration frequency increases, the thickness of the chip may be correspondingly thinner. Therefore, in some embodiments, the method for making the quartz crystal resonator may include a step of: determining a cutting thickness for cutting the quartz bar based on a target frequency of the quartz crystal resonator, to obtain a quartz crystal with a required cutting thickness.

Figure 6:
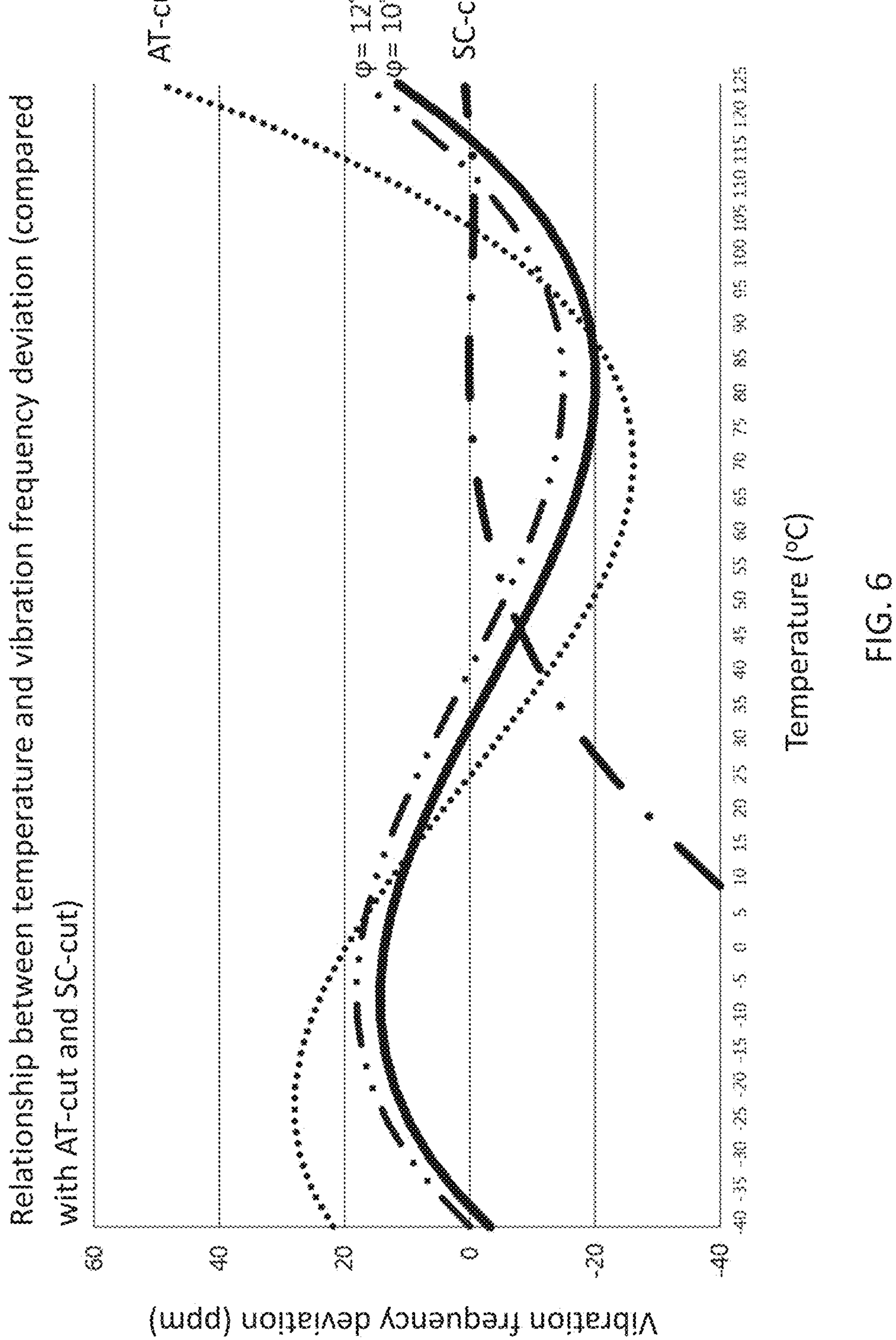
FIG. 6 is a graph showing a relationship between temperature and vibration frequency deviation according to some embodiments of the present disclosure and some comparative examples (compared with AT-cut and SC-cut)

Comparing some embodiments of the present disclosure with quartz crystals obtained by the AT-cut (the second angle φ is 0°), as shown in FIG. 6, the quartz crystals cut according to the embodiments of the present disclosure meet the requirements of the vibration frequency deviation in a wider operating temperature range, and especially in the operating temperature range from about −40° C. to about 125° C., and they at least meet the requirement of having a vibration frequency deviation within ±20 ppm. Compared with other existing quartz crystal cutting methods, for example, the aforementioned SC-cut, which also has methods involving the use of double rotation to obtain the cutting angle, the SC-cut is a cutting method that increases the vibration frequency deviation inflection point of the quartz crystal from about 25° C. of the AT-cut to about 93° C. However, the SC-cut is to increment the main operating temperature range of the quartz crystal to a range relatively higher than that of the AT-cut, and it is unable to provide the specific vibration frequency deviation in a wide operating temperature range, which is provided by the quartz crystal resonator as disclosed in the embodiments of the present disclosure. In fact, as shown in FIG. 6, a SC-cut quartz crystal has a large vibration frequency deviation beyond −20 ppm at a temperature below about 30° C., and thus, it cannot be applied to an operating environment having a temperature below the room temperature.

The embodiments as described above satisfy the Requirement I as described with respect to table 2. The embodiment cutting method for cutting a quartz crystal from a quartz bar includes rotating a cutting plane to form the angle θ of about 35° to about 36° between the cutting plane and the optic axis, followed by rotating the cutting plane to form the angle φ between the cutting plane and the electrical axis, where φ may have a value between about 10° and about 12°. In specific embodiments, θ may take the values that are used in AT-cut. In some embodiments, φ=10° or φ=12°. The quartz bar may then be cut along the cutting plane to obtain the quartz crystal. The obtained quartz crystal has advantages of providing characteristics satisfying the Requirement I, and presenting a vibration frequency deviation within the range between −20 ppm and +20 ppm in an operating temperature range from about −40° C. to about 125° C. The embodiment cutting method may be referred to as DR1-cut (double rotation 1-cut) for illustrative convenience only.

In some embodiments, another cutting method for cutting a quartz crystal from a quartz bar may be provided. The obtained quartz crystal has advantages of providing characteristics satisfying the Requirement II, and presenting a vibration frequency deviation within a range between −30 ppm and +30 ppm in an operating temperature range from about −50° C. to about 150° C. Characteristics of the obtained quartz crystal include an inflection point of vibration frequency deviation from about 43° C. (degrees Celsius) to about 56° C. The embodiment cutting method may be referred to as DR2-cut for illustrative convenience only.

Figure 7:
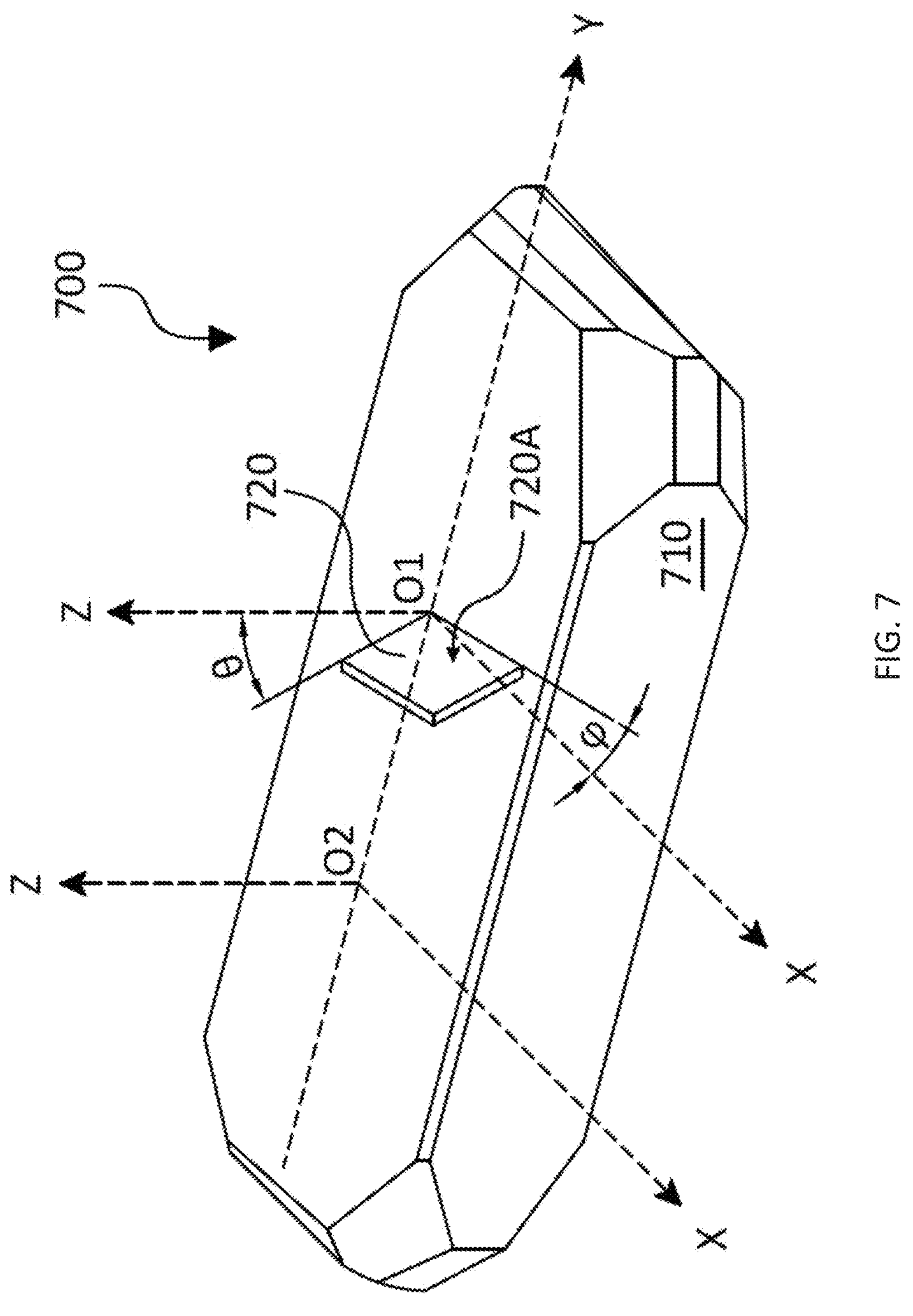
FIG. 7 is a schematic diagram of a quartz bar in a X-Y-Z coordinate system according to embodiments of the present disclosure.

Referring to FIG. 7, FIG. 7 is a schematic diagram 700 of a quartz bar 710 in the X-Y-Z coordinate system. As described above, the X-Y-Z coordinate system includes the optic axis (Z), the electrical axis (X) and the mechanical axis (Y) perpendicular to each another. The X-Y-Z coordinate system is configured based on the quartz bar, and for determining the cutting angles to cut quartz crystals from the quartz bar 710 and. The origin of the X-Y-Z coordinate system may be located anywhere on the quartz bar 710, e.g., based on where the quartz crystal(s) to be cut from the quartz bar 710 is/are located. For example, the origin may be at the position O1 or O2 as shown in FIG. 7. The quartz bar 710 is similar to the quartz bar 10 shown in FIG. 1.

FIG. 7 shows a quartz crystal 720 that is cut from the quartz bar 710 according to the embodiment cutting method DR2-cut. Between a major face 720A of the quartz crystal 720 and the optic axis Z is a first angle θ that is rotated around the electrical axis X by about 35 degrees to about 36 degrees, and between the major face 720A and the electrical axis X is a second angle φ that is formed by rotating around the optic axis Z. In some embodiments, the first angle θ may have a value that is used in AT-cut. For example, θ=35° 15', or θ=35° 25'. In some embodiments, the second angle φ may have a value that is from about 14° to about 16°. For example, φ=14°, 14° 15', 15°, 15° 25', 15° 45', or 16°.

Figure 8:
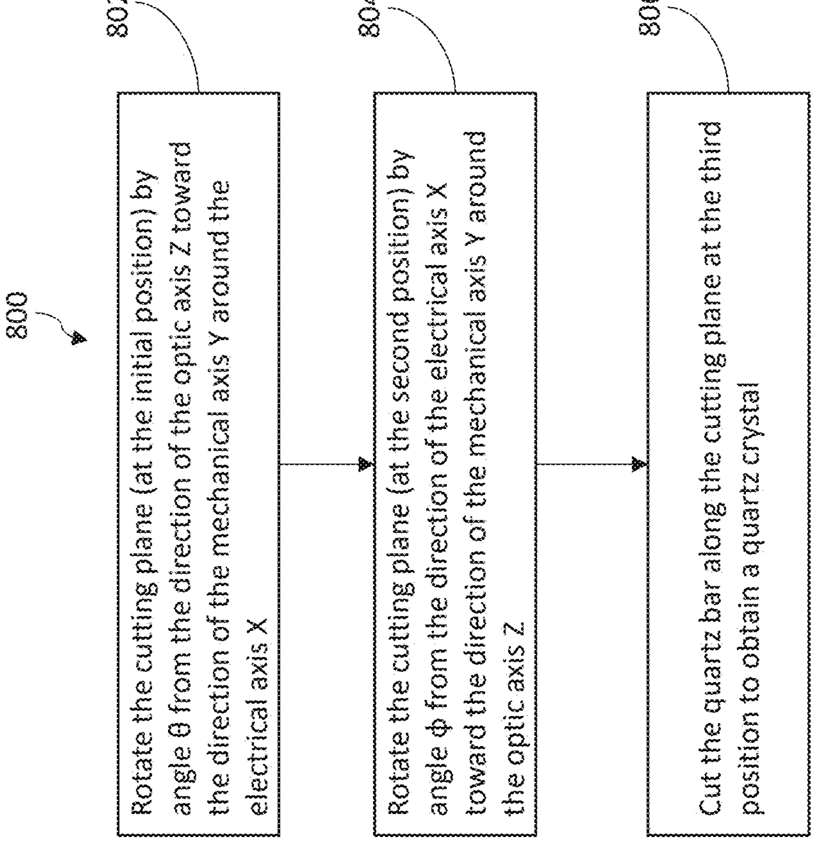
FIG. 8 is a flowchart of an example method for cutting a quartz bar according to embodiments of the present disclosure.
Figure 9:
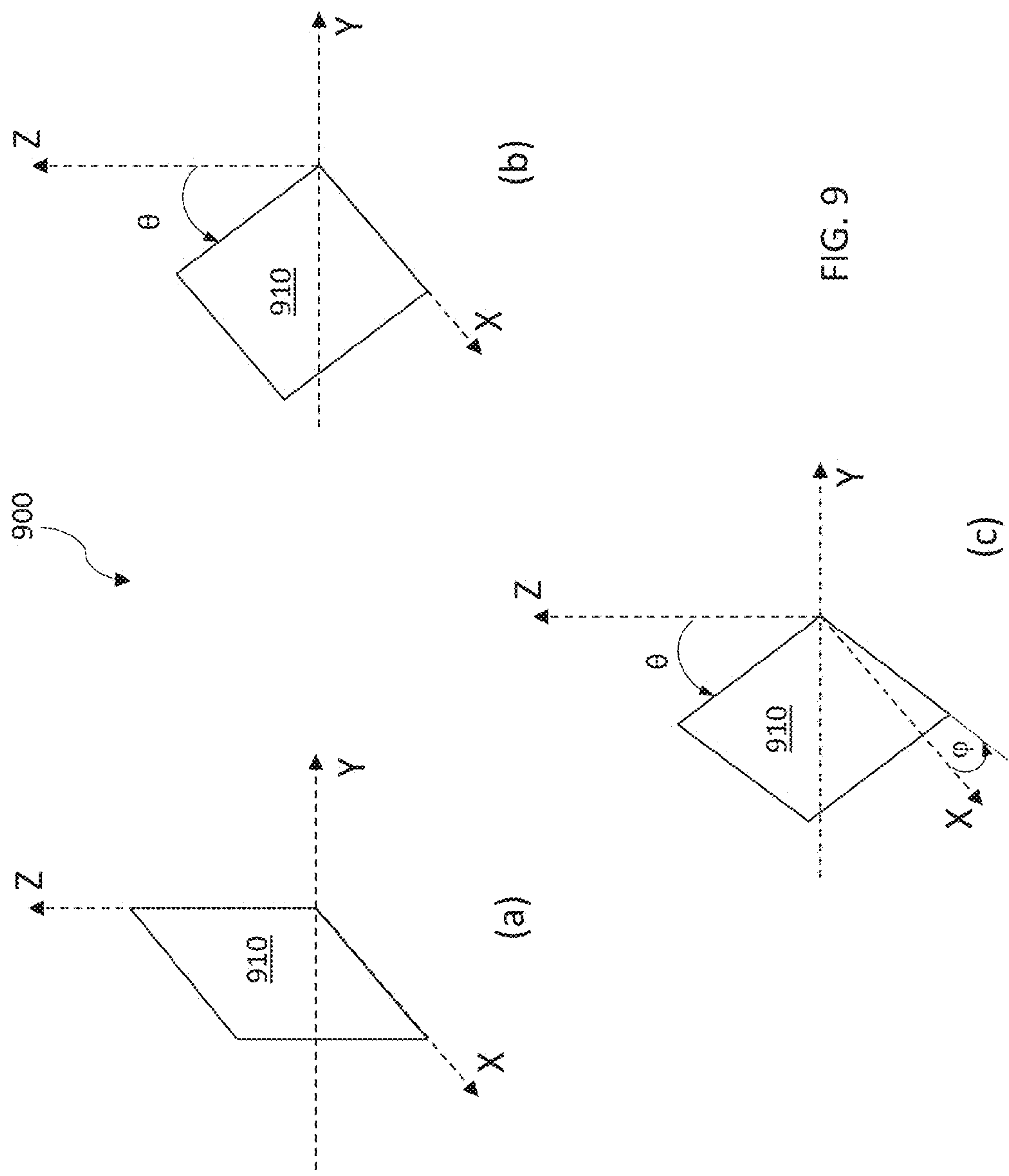
FIG. 9 is a diagram of an example cutting plane oriented according to an embodiment cutting method.

FIG. 8 is a flowchart of an example DR2-cut method 800 for cutting the quartz bar 710 to obtain the quartz crystal 720. The method 800 involves double rotation by the angle θ and the angle φ. In some embodiments, a cutting plane 910 as shown in FIG. 9 may be determined in order to the cut the quartz bar 710 according to the specific angles θ and φ. FIG. 9 shows the cutting plane 910 oriented at different positions in the X-Y-Z coordinate system in order to put the cutting plane 910 at desired angles for cutting. The method 800 will be described with reference to FIG. 7, FIG. 8 and FIG. 9.

In some embodiments, the cutting plane 910 may be initially set to be the same as the X-Z plane, and the cutting plane 910 is referred to as being at an initial position, as shown in diagram (a) of FIG. 9. The method 800 may include rotating the cutting plane 910 (which is at the initial position) by the angle θ from the direction of the optic axis Z toward the direction of the mechanical axis Y around the electrical axis X (step 802), such that the cutting plane 910 is at a second position, as shown in diagram (b) of FIG. 9. At the second position, the cutting plane 910 has the angle θ from the optic axis Z, where θ may have a value from about 35° to about 36°. As described above, rotation of the angle θ is counterclockwise from the axis Z toward the axis Y, as the angle θ is represented by a positive value.

The method 800 may further include rotating the cutting plane 910 (which is at the second position) by the angle φ from the direction of the electrical axis X toward the direction of the mechanical axis Y around the optic axis Z (step 804), such that the cutting plane 910 is at a third position, as shown in diagram (c) of FIG. 9. At the third position, the cutting plane 910 has the angle θ from the optic axis Z, where θ may have a value from about 35° to about 36°, and has the angle φ from the electrical axis X, where φ may have a value from about 14° to about 16°. As described above, rotation of the angle φ is counterclockwise from the axis X toward the axis Y, as the angle φ is represented by a positive value.

The method 800 may further include cutting the quartz bar 710 along the cutting plane 910 at the third position to obtain a quartz crystal (step 806), e.g., the quartz crystal 720. In an example, multiple slices of quartz crystals similar to the quartz crystal 720 may be cut from the quartz bar 710, with cutting planes set to be parallel to the cutting plane 910 at the third position.

The method 800 above may also be used to perform DR1-cut, with φ set with different values as described with respect to DR1-cut. DR1-cut and DR2-cut may both select a value for the angle θ in a range from about 35° to about 36°. DR1-cut may select a value for the angle φ in a range between about 10° and about 12°. DR2-cut may select a value for the angle φ in a range between about 14° and about 16°.

The method 800 shows an example to determining/positioning a cutting plane for cutting. In this example, the cutting plane 910 at an initial position is rotated/oriented to have the desired angles θ from the optic axis Z and φ from the electrical axis X. Other methods may also be used to determine the cutting plane without departing from the spirit and principle of the present disclosure. For example, the quartz bar may be oriented so that a cutting plane at the desired angles θ and φ is located. In this case, as the X-Y-Z coordinate system is set based on the quartz bar, orienting the quartz bar is equivalent to rotating the X-Y-Z coordinate system. How to orient the quartz bar to obtain the desired cutting plane is not detailed here as it is a commonly known mathematical concept.

Figure 10:
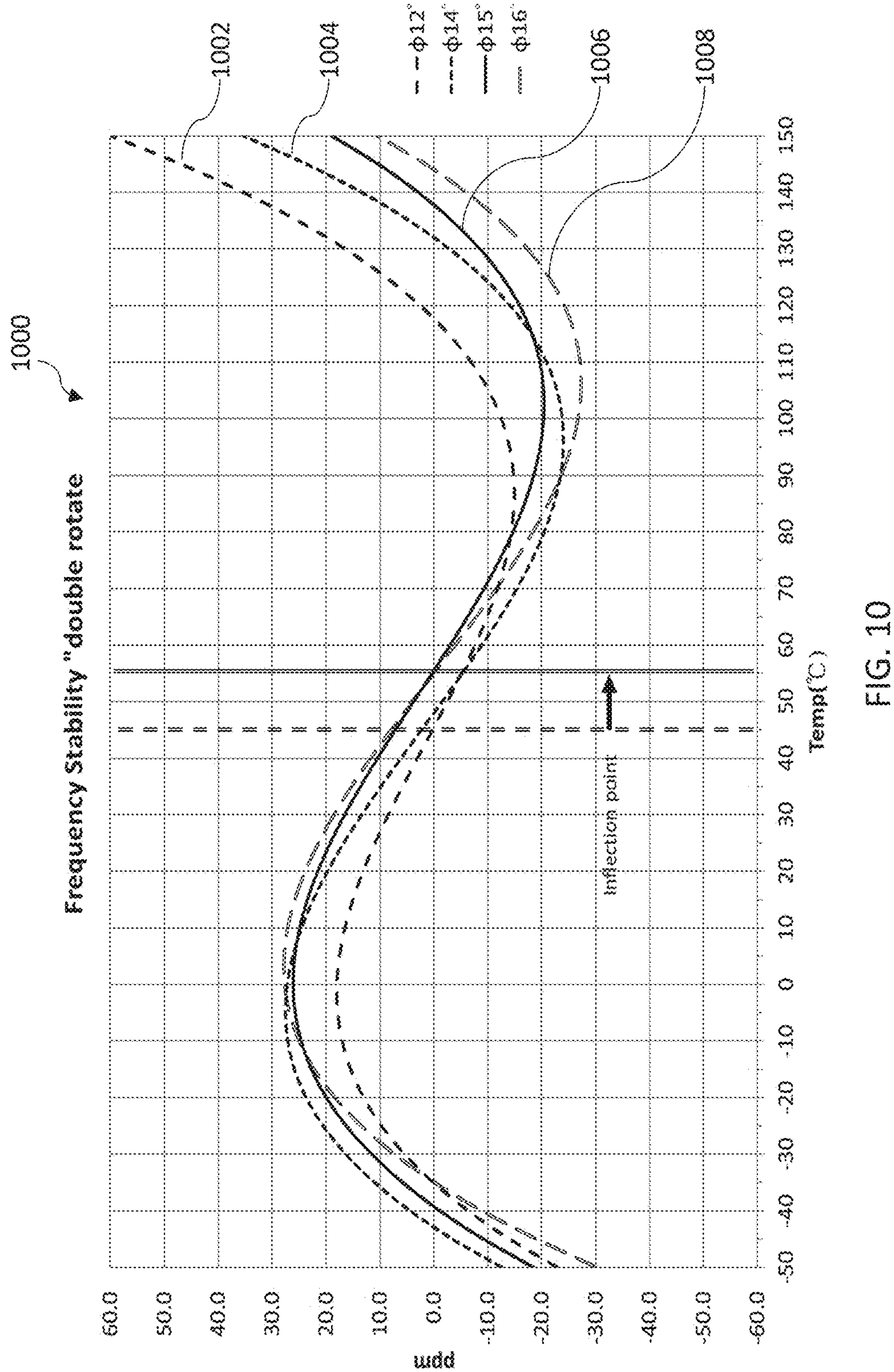
FIG. 10 is a graph showing relationships between vibration frequency deviation (ppm) and temperature (° C.) of quartz crystals cut by use of different cutting methods according to embodiments of the present disclosure.

FIG. 10 is a graph showing relationships between vibration frequency deviation (ppm) and temperature (° C.) of quartz crystals cut by use of different cutting methods according to embodiments of the present disclosure. The horizontal axis represents temperature in the range from about −50° C. to about 150° C., and the vertical axis represents vibration frequency deviation in ppm. In this example, the cutting methods include the embodiment cutting methods DR1-cut and DR2-cut as described above. Both methods use the same value for the angle θ, e.g., the value used in AT-cut. FIG. 10 shows four curves 1002, 1004, 1006 and 1008. Curve 1002 represents the relationship of a quartz crystal cut using DR1-cut, where φ=12°. Curves 1004, 1006 and 1008 represent the relationships of quartz crystals obtained using DR2-cut, where φ=14°, 15°, 16°, respectively. The relationships between vibration frequency deviation (ppm) and temperature (° C.) of quartz crystals in this example all present the characteristics of cubic curves.

As shown, curves 1002 and 1004 have inflection points of vibration frequency deviation that are close to each other and at around 40° C.~50° C., where the quartz crystals have substantially no or very small vibration frequency deviation. Curves 1006 and 1008 have inflection points of vibration frequency deviation that are close to each other and at around 50° C.~60° C., where the quartz crystals have substantially no or very small vibration frequency deviation.

Curve 1002 shows that the quartz crystal cut according to DR1-cut can provide vibration frequency deviation within {−25 ppm, +30 ppm} in the temperature range from about −50° C. to about 136° C. However, when the temperature increases to be above 136° C., the vibration frequency deviation exceeds 30 ppm, and increases quickly to reach 60 ppm at about 150° C. Therefore, DR1-cut with φ=12° does not satisfy the Requirement II.

Curve 1004 shows that the quartz crystal cut according to DR2-cut with φ=14° can provide vibration frequency deviation within {−30 ppm, +30 ppm} in the temperature range from about −50° C. to about 145° C. However, when the temperature increases to be over 145° C., the vibration frequency deviation exceeds 30 ppm, and increases to be about 35 ppm at about 150° C. It has a negative peak deviation from about −25 ppm to about −22 ppm in {90° C., 100° C.}. When in the temperature range {−50° C., 50° C.}, it has a positive peak deviation from about 25 ppm to 28 ppm. DR2-cut with φ=14° (curve 1004) behaves better than DR1-cut (curve 1002), however, it does not ensure a vibration frequency deviation less than 30 ppm when the temperature reaches 150° C. Thus, this cutting method may not completely satisfy the Requirement II.

Curve 1006 shows that the quartz crystal cut according to DR2-cut with φ=15° can provide vibration frequency deviation within {−21 ppm, +30 ppm} in the temperature range from about −50° C. to about 150° C. It has a positive peak deviation from about 24 ppm to about 27 ppm in {−5° C., +5° C.}, and a negative peak deviation from about −21 ppm to −18 ppm in {100° C., 110° C.}. This cutting method satisfies the Requirement II, and provides good performance in terms of vibration frequency deviation in a wide operating temperature range.

Curve 1008 shows that the quartz crystal cut according to DR2-cut with φ=16° can provide vibration frequency deviation within {−30 ppm, +30 ppm} in the temperature range from about −50° C. to about 150° C. It has a positive peak deviation from about 25 ppm to about 28 ppm in {−5° C., +5° C.}, and a negative peak deviation from about −28 ppm to about −25 ppm in {105° C., 115° C.}. This cutting method satisfies the Requirement II, and provides good performance in terms of vibration frequency deviation over a wide range of temperature.

Quartz crystals may be cut from a quartz bar using a cutting/slicing machine, e.g., a quartz cutting machine, which provides precise cutting according to a cutting method. The machine may be equipped with a cutting tool, such as a saw (e.g., a diamond wire saw), a laser cutting system or an ultrasonic cutting system, for cutting a quartz bar. After being cut from a quartz bar, the quartz crystals may be ground and polished to achieve the desired thickness and surface finish. Quartz crystals of embodiments of the present disclosure may be cut using any applicable machines that are currently existing or to be developed in future.

In some embodiments, a quartz crystal may be cut from a quartz bar according to the embodiment cutting method DR2-cut using a quartz cutting machine. The angle θ may have a value from about 35° to about 36°, e.g., θ=35° 15', or θ=35° 25', and the angle φ may have a value from about 14° to about 16°, e.g., φ=15°. As described above, a cutting plane oriented at the desired angles may be determined, and the quartz bar may then be cut along the determined cutting plane. As an example, the quartz bar may be placed in a platform of the quartz cutting machine, and oriented/rotated such that the cutting plane of the desired angles is located for the cutting saw to operate. As another example, laser light may be used to locate the cutting plane of the desired angles. With the angles θ and φ selected and set, how to determine/locate the cutting plane may vary depending on the design and operation of the quartz cutting machines.

The vibration frequency of the quartz crystal may be determined by the cut, the size and the shape of the quartz crystal. One of the determining factors of the vibration frequency is the thickness of the quartz crystal. The thickness of the quartz crystal needs be designed and precisely maintained in order to achieve the desired frequency. Adjustment of the frequency may sometimes also be accomplished by plating small amounts of gold onto the quartz crystal. Quartz crystals may be manufactured for frequencies from a few tens of kilohertz (KHz) to hundreds of megahertz (MHz).

Figure 11:
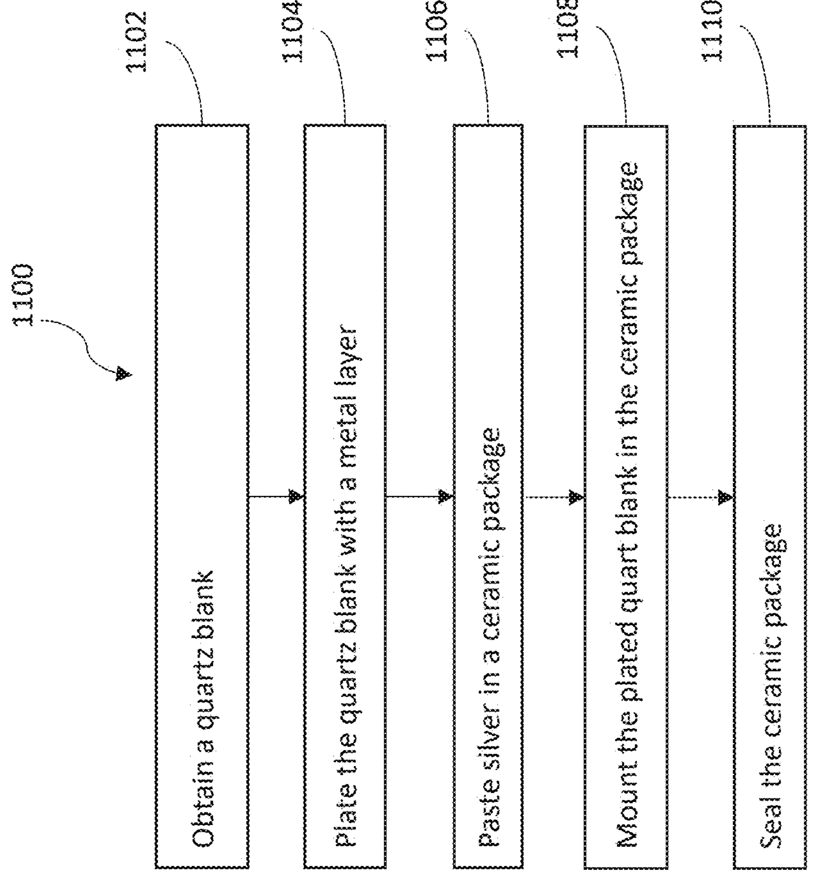
FIG. 11 is a flowchart of an example method for making a quartz crystal resonator according to embodiments of the present disclosure.
Figure 12:
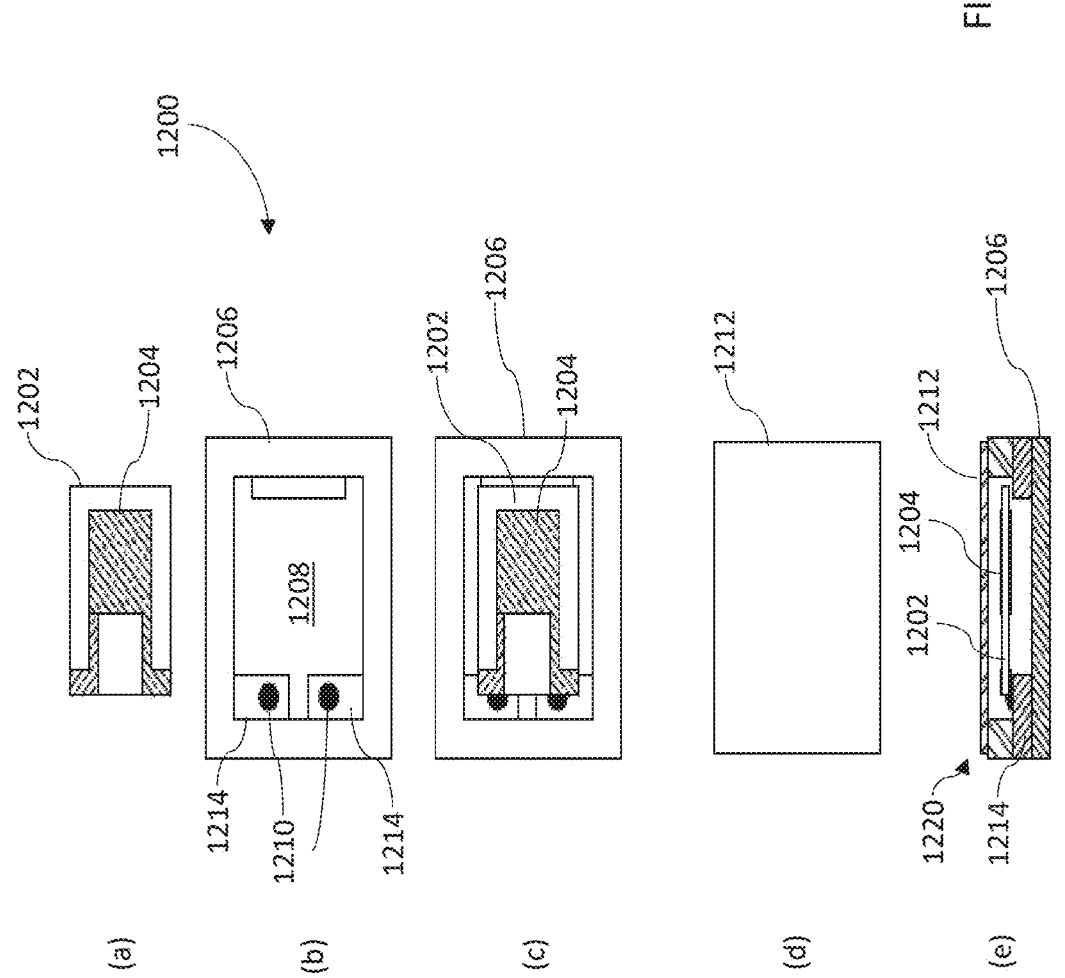
FIG. 12 is a diagram showing an example quartz crystal resonator made according to the method of FIG. 11.

The obtained quartz crystal may be used to make a quartz crystal resonator. FIG. 11 is a flowchart of an example method 1100 for making a quartz crystal resonator according to embodiments of the present disclosure. The method 1100 may be used to make/build/assemble a quartz crystal resonator using a quartz crystal that is cut according to any of the embodiment cutting methods described above. The method 1100, however, is provided merely as an example for illustrative purposes. Other methods for making a quartz crystal resonator may also be applicable. FIG. 12 is a diagram 1200 showing an example quartz crystal resonator made using the method 1100. The quartz crystal resonator may also be referred to as a resonator for illustrative convenience. The method 1100 will be described in the following with reference to FIG. 12.

As shown, the method 1100 may include obtaining a quartz blank (step 1102), such as a quartz blank 1202 shown in diagram (a) of FIG. 12. Diagram (a) is a top view of the quartz blank 1202, with a major face of the quartz blank 1202 facing upward. The quartz blank 1202 may be a quartz crystal cut from a quartz bar by use of a cutting method, e.g., the cutting method DR1-cut or DR2-cut as described above. The quartz blank 1202 is cut according to a specific cutting method and has a dimension, such as thickness and size, as designed based on specific requirements, such as a resonant frequence, vibration frequency deviations, temperature tolerance, and other performance and characteristic related requirements. Obtaining the quartz blank may include one or more steps of following: obtaining a quartz bar, determining a cutting plane according to a cutting method in order to cut the quartz bar (e.g., as described with respect to FIG. 8), cutting the quartz bar to obtain a quartz crystal slice, and further processing the quartz crystal slice to obtain the quartz blank with a designed thickness, shape, surface finish, and the like.

The quartz blank 1202 may be plated with a metal layer (step 1104), such as a metal layer 1204 in FIG. 12. The metal layer 1204 may be made of gold, aluminum, or other types of metal, and may be plated on both sides of the quartz blank 1202. In an example, the metal layer 1204 may be deposited onto a specific area of the quartz blank 1202, e.g., as shown in FIG. 12. The metal layer 1204 serves as an electrode, and is used to adjust the frequency of the resonator, e.g., by controlling the mass and geometry of the electrode to achieve a desired resonant frequency of the resonator.

The plated quartz blank 1202 may be mounted in a package or a holder. Care should be exercised in mounting to avoid placing a strain on the quartz blank 1202. After the quartz blank 1202 is mounted, a suitable encasement is selected to enclose the quartz blank 1202. The encasement reduces the effects of contamination, humidity, and atmospheric changes.

In this example, a ceramic package 1206 may be used for supporting and containing the plated quartz blank 1202. Diagram (b) of FIG. 12 is top view of the ceramic package 1206. A designated region 1208 may be defined in the ceramic package 1206, where the plated quartz blank 1202 may be mounted. A silver layer 1210 may be pasted in the ceramic package 1206 (step 1106), e.g., at node 1214. The plated quartz blank 1202 is mounted in the ceramic package 1206 by its edges or corners (step 1108). The plated quartz blank 1202 is bonded to the ceramic package 1206 through the silver layer 1210 at the node 1214, and suspended over the bottom of the ceramic package 1206. The silver layer 1210 may be replaced by other material that is applicable for bonding/attaching the quartz blank 1202 to the ceramic package 1206. Diagram (c) of FIG. 12 is a top view of the ceramic package 1206 with the plated quartz blank 1202 mounted in the ceramic package 1206 through the silver layer 1210.

After the plated quartz blank 1202 is mounted in the ceramic package 1206, the ceramic package 1206 may then be sealed (step 1110). For example, a lid 1212 may be seam welded on top of the ceramic package 1206 to seal ceramic package 1206, enclosing the plated quartz blank 1202 inside the ceramic package 1206. Diagram (d) of FIG. 12 is a top view of the lid 1212. The lid 1212 may be a copper lid, or made of other applicable metal. The ceramic package 1206 provides a hermetically seam-sealed enclosure for the quartz blank 1202. This provides a clean environment and allows for uniform heat distribution. Diagram (e) of FIG. 12 is a cross-sectional view showing the resonator 1220 that is assembled.

When the quartz blank 1202 is cut using the embodiment method DR1-cut or DR2-cut, the resulted resonator 1220 can provide an accurate resonant frequency with a deviation within ±20 ppm in an operating temperature ranging from about −40° C. to about 125° C., or an accurate resonant frequency with a deviation within ±30 ppm in an operating temperature ranging from about −50° C. to about 150° C. The resonator 1220 provides a small vibration frequency deviation over a wide operating temperature range, and has good ambient temperature tolerance.

Figure 13:
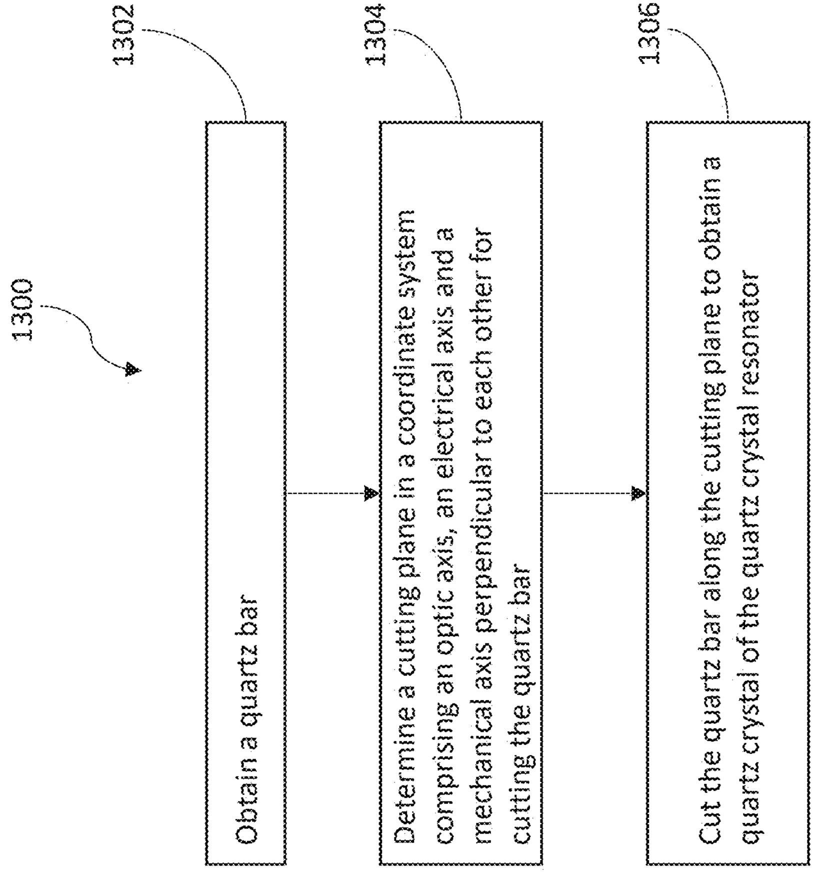
FIG. 13 is a flowchart of yet another example method for making a quartz crystal resonator according to embodiments of the present disclosure.

FIG. 13 is a flowchart of another example method 1300 for making a quartz crystal resonator according to embodiments of the present disclosure. The method 1300 may be used to make a quartz crystal resonator using a quartz crystal that is cut according to the embodiment method DR1-cut or the DR2-cut. As shown, the method 1300 includes obtaining a quartz bar (step 1302). The method 1300 may further include determining a cutting plane in a coordinate system comprising an optic axis, an electrical axis and a mechanical axis perpendicular to each other for cutting the quartz bar (step 1304). As an example, the cutting plane may have a first angle of about 35° to about 36° from the optic axis and a second angle of about 14° to about 16° from the electrical axis. The coordinate system may be defined based on the quartz bar. The method 1300 may further include cutting the quartz bar along the cutting plane to obtain a quartz crystal of the quartz crystal resonator (step 1306).

Figure 14:
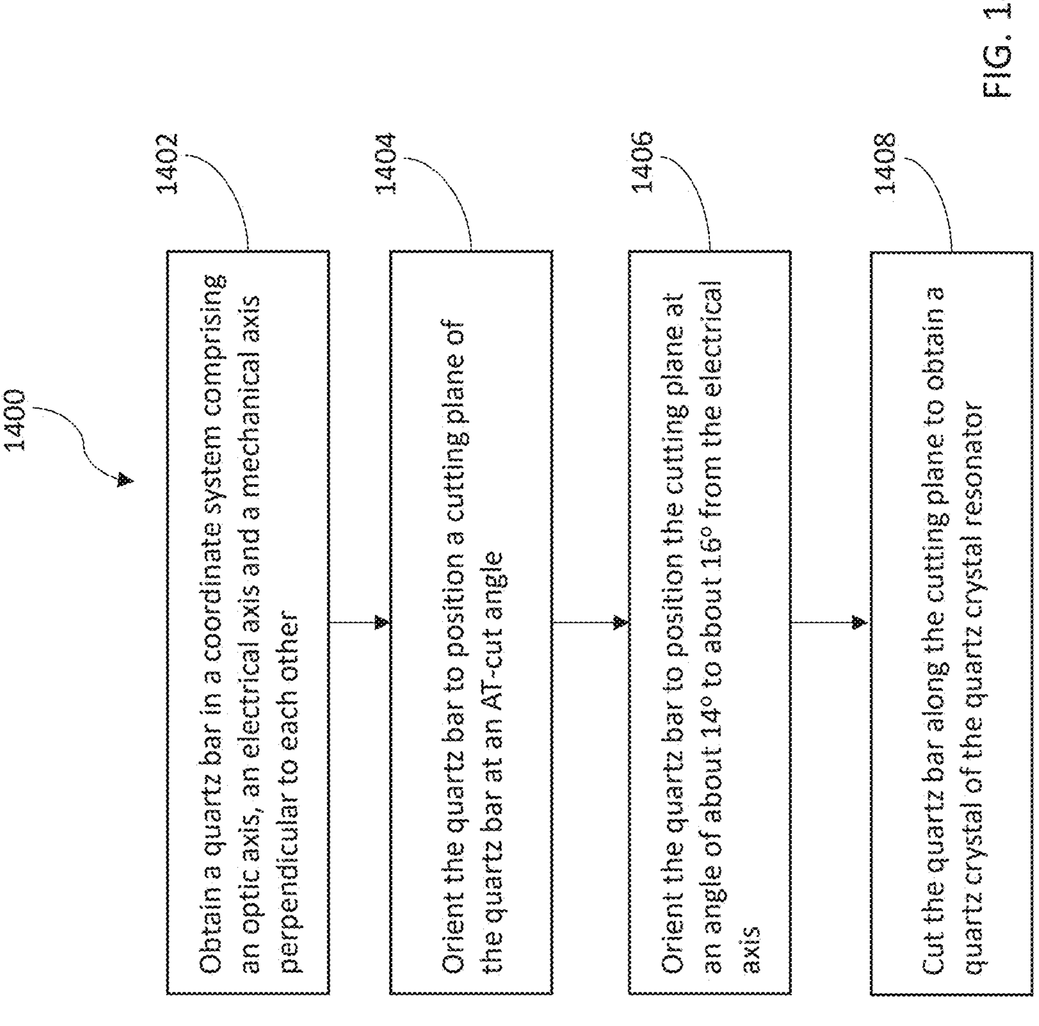
FIG. 14 is a flowchart of yet another example method for making a quartz crystal resonator according to embodiments of the present disclosure.

FIG. 14 is a flowchart of another example method 1400 for making a quartz crystal resonator according to embodiments of the present disclosure. The method 1400 may be used to make a quartz crystal resonator using a quartz crystal that is cut according to the embodiment method DR1-cut or the DR2-cut. As shown, the method 1400 includes obtaining a quartz bar in a coordinate system comprising an optic axis, an electrical axis and a mechanical axis perpendicular to each other (step 1402). The method 1400 may further include orienting the quartz bar to position a cutting plane of the quartz bar at an AT-cut angle (step 1404). The method 1400 may further include orienting the quartz bar to position the cutting plane at an angle of about 14° to about 16° from the electrical axis (step 1406). The method 1400 may also include cutting the quartz bar along the cutting plane to obtain a quartz crystal of the quartz crystal resonator (step 1408).

The foregoing provides features of certain embodiments of the present disclosure for those ordinarily skilled in the art to more fully understand the various aspects of the present disclosure. Those of ordinary skill in the art of the present disclosure should understand that they can readily design or modify other processes and structures based on the present disclosure to achieve the same purposes and/or achieve the same advantages as the embodiments herein. Those of ordinary skill in the art of the present disclosure should also understand that these equivalent embodiments still belong to the spirit and scope of the present disclosure, and various alterations, substitutions and changes can be made without departing from the spirit and scope of the present disclosure.

Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A quartz crystal resonator comprising:

a quartz crystal obtained from a quartz bar, the quartz crystal being cut from the quartz bar along a cutting plane in a coordinate system having an optic axis, an electrical axis and a mechanical axis perpendicular to each other, and the cutting plane having a first angle of about 35° to about 36° from the optic axis, and a second angle of about 14° to about 16° from the electrical axis rotated around the optic axis.

2. The quartz crystal resonator of claim 1, wherein the first angle is about 35 degrees 15 minutes or 35 degrees 25 minutes.

3. The quartz crystal resonator of claim 1, wherein the quartz crystal has a vibration frequency deviation within a range from −30 parts per million (ppm) to about +30 ppm over a temperature range from about −50° C. to about 150° C.

4. The quartz crystal resonator of claim 1, wherein the second angle is about 15°.

5. The quartz crystal resonator of claim 4, wherein a vibration frequency deviation of the quartz crystal has a positive peak value over a temperature range from about-5° C. to about 5° C.

6. The quartz crystal resonator of claim 5, wherein the positive peak value is from about 24 ppm to about 27 ppm.

7. The quartz crystal resonator of claim 4, wherein a vibration frequency deviation of the quartz crystal has a negative peak value over a temperature range from about 100° C. to about 110° C.

8. The quartz crystal resonator of claim 7, wherein the negative peak value is from about −21 ppm to about −18 ppm.

9. The quartz crystal resonator of claim 1, wherein the first angle is obtained by rotation of the cutting plane counterclockwise about the electrical axis, and the second angle is obtained by rotation of the cutting plane counterclockwise about the optic axis.

10. A method of making a quartz crystal resonator, comprising:

obtaining a quartz bar;

determining a cutting plane in a coordinate system comprising an optic axis, an electrical axis and a mechanical axis perpendicular to each other for cutting the quartz bar, the cutting plane having a first angle of about 35° to about 36° from the optic axis, and a second angle of about 14° to about 16° from the electrical axis rotated around the optic axis; and cutting the quartz bar along the cutting plane to obtain a quartz crystal of the quartz crystal resonator.

11. The method of claim 10, wherein determining the cutting plane comprises:

rotating the cutting plane counterclockwise about the electrical axis by the first angle; and thereafter, rotating the cutting plane counterclockwise about the optic axis by the second angle.

12. The method of claim 10, further comprising:

assembling the quartz crystal in a package to obtain the quartz crystal resonator.

13. The method of claim 10, wherein the quartz crystal resonator has a vibration frequency deviation within a range from −30 parts per million (ppm) to about +30 ppm over a temperature range from about −50° C. to about 150° C.

14. The method of claim 10, wherein the second angle is about 15°, a vibration frequency deviation of the quartz crystal resonator has a positive peak value over a temperature range from about −5° C. to about 5° C., and a negative peak value over a temperature range from about 100° C. to about 110° C.

15. The method of claim 10, further comprising:

determining a cutting thickness of the quartz crystal according to a target frequency of the quartz crystal resonator.

16. A method of making a quartz crystal resonator, comprising:

obtaining a quartz bar in a coordinate system comprising an optic axis, an electrical axis and a mechanical axis perpendicular to each other;

orienting the quartz bar to position a cutting plane of the quartz bar at an AT-cut angle;

orienting the quartz bar to position the cutting plane at an angle of about 14° to about 16° from the electrical axis rotated around the optic axis; and cutting the quartz bar along the cutting plane to obtain a quartz crystal of the quartz crystal resonator.

17. The method of claim 16, wherein the quartz crystal resonator has a vibration frequency deviation within a range from −30 parts per million (ppm) to about +30 ppm over a temperature range from about −50° C. to about 150° C.

18. The method of claim 16, wherein the angle is about 15°.

19. The method of claim 18, wherein a vibration frequency deviation of the quartz crystal resonator has a positive peak value over a temperature range from about −5° C. to about 5° C., and a negative peak value over a temperature range from about 100° C. to about 110° C.

20. The method of claim 16, further comprising:

determining a cutting thickness of the quartz crystal according to a target frequency of the quartz crystal resonator.

* * * * *